United States Patent
Takemura

(10) Patent No.: US 10,135,446 B2
(45) Date of Patent: Nov. 20, 2018

(54) SEMICONDUCTOR DEVICE AND METHOD OF DRIVING SEMICONDUCTOR DEVICE

(71) Applicant: Semiconductor Energy Laboratory Co., Ltd., Atsugi-shi, Kanagawa-ken (JP)

(72) Inventor: Yasuhiko Takemura, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/368,932

(22) Filed: Dec. 5, 2016

(65) Prior Publication Data

US 2017/0085267 A1 Mar. 23, 2017

Related U.S. Application Data

(63) Continuation of application No. 13/467,427, filed on May 9, 2012, now Pat. No. 9,673,823.

(30) Foreign Application Priority Data

May 18, 2011 (JP) ................................. 2011-111098

(51) Int. Cl.
*H03K 19/173* (2006.01)
*H01L 27/108* (2006.01)
(Continued)

(52) U.S. Cl.
CPC ... *H03K 19/1736* (2013.01); *H01L 27/10805* (2013.01); *H01L 27/124* (2013.01);
(Continued)

(58) Field of Classification Search
None
See application file for complete search history.

(56) References Cited

U.S. PATENT DOCUMENTS

| 4,455,754 A | 6/1984 | Benjamin |
| 5,594,698 A | 1/1997 | Freeman |

(Continued)

FOREIGN PATENT DOCUMENTS

| EP | 1583239 A | 10/2005 |
| EP | 1737044 A | 12/2006 |

(Continued)

OTHER PUBLICATIONS

Fortonato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

(Continued)

*Primary Examiner* — Minh D A
*Assistant Examiner* — James H Cho
(74) *Attorney, Agent, or Firm* — Robinson Intellectual Property Law Office; Eric J. Robinson

(57) ABSTRACT

A semiconductor device using a programming unit with is provided. A highly reliable semiconductor device using the programming unit is provided. A highly integrated semiconductor device using the programming unit is provided. In a semiconductor circuit having a function of changing a structure of connections between logic cells such as PLDs, connection and disconnection between the logic cells or power supply to the logic cells is controlled by a programming unit using an insulated gate field-effect transistor with a small amount of off-state current or leakage current. A transfer gate circuit may be provided in the programming unit. To lower driving voltage, a capacitor may be provided in the programming unit and the potential of the capacitor may be changed during configuration and during operation.

18 Claims, 13 Drawing Sheets

(51) Int. Cl.
*H03K 19/177* (2006.01)
*H01L 27/12* (2006.01)

(52) U.S. Cl.
CPC ...... *H01L 27/1207* (2013.01); *H01L 27/1225* (2013.01); *H01L 27/1255* (2013.01); *H03K 19/1776* (2013.01); *H03K 19/17736* (2013.01); *H03K 19/17796* (2013.01)

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 5,886,920 A | 3/1999 | Marshall et al. | |
| 6,097,212 A * | 8/2000 | Agrawal | H03K 19/1737 326/38 |
| 6,157,213 A | 12/2000 | Voogel | |
| 6,172,521 B1 | 1/2001 | Motomura | |
| 6,208,559 B1 | 3/2001 | Tu et al. | |
| 6,274,439 B1 | 8/2001 | Ito | |
| 6,294,274 B1 | 9/2001 | Kawazoe et al. | |
| 6,563,174 B2 | 5/2003 | Kawasaki et al. | |
| 6,646,743 B2 | 11/2003 | Herman et al. | |
| 6,650,143 B1 | 11/2003 | Peng | |
| 6,727,522 B1 | 4/2004 | Kawasaki et al. | |
| 6,775,171 B2 | 8/2004 | Novosel et al. | |
| 6,775,197 B2 | 8/2004 | Novosel et al. | |
| 6,972,986 B2 | 12/2005 | Peng et al. | |
| 6,984,859 B2 | 1/2006 | Ashida | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,064,973 B2 | 6/2006 | Peng et al. | |
| 7,105,868 B2 | 9/2006 | Nause et al. | |
| 7,135,886 B2 | 11/2006 | Schlacter | |
| 7,211,825 B2 | 5/2007 | Shih et al. | |
| 7,221,580 B1 | 5/2007 | Penchuk | |
| 7,242,049 B2 * | 7/2007 | Forbes | H01L 21/28273 257/315 |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,759,969 B2 | 7/2010 | Madurawe | |
| 7,772,053 B2 | 8/2010 | Kameshiro et al. | |
| 7,982,250 B2 | 7/2011 | Yamazaki et al. | |
| 8,199,590 B1 * | 6/2012 | Novosel | G11C 17/16 365/189.2 |
| 8,208,312 B1 * | 6/2012 | Novosel | G11C 17/16 365/189.011 |
| 8,816,349 B2 | 8/2014 | Yamazaki et al. | |
| 9,177,855 B2 | 11/2015 | Yamazaki et al. | |
| 9,601,635 B2 | 3/2017 | Yamazaki et al. | |
| 10,043,915 B2 | 8/2018 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0096483 A1 * | 5/2003 | Lee | H01L 21/265 438/303 |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0169040 A1 * | 8/2005 | Peng | G11C 11/405 365/149 |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0062068 A1 * | 3/2006 | Schlacter | G11C 14/00 365/222 |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0256057 A1 | 11/2006 | Han et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0136750 A1 * | 6/2008 | Benzarti | G09G 3/3233 345/76 |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0283763 A1 * | 11/2009 | Park | H01L 29/78621 257/43 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0019491 A1 | 1/2011 | Kurjanowicz et al. | |
| 2011/0058116 A1 | 3/2011 | Yamazaki et al. | |
| 2011/0101351 A1 | 5/2011 | Yamazaki | |

(56) References Cited

U.S. PATENT DOCUMENTS

| | | |
|---|---|---|
| 2011/0175646 A1 | 7/2011 | Takemura et al. |
| 2011/0175656 A1 | 7/2011 | Yu et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-130390 A | 5/1989 |
| JP | 02-291720 A | 12/1990 |
| JP | 05-251705 A | 9/1993 |
| JP | 08-508361 | 9/1996 |
| JP | 08-264794 A | 10/1996 |
| JP | 10-285014 A | 10/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2004-356614 A | 12/2004 |
| JP | 2005-269616 A | 9/2005 |
| JP | 2006-313999 A | 11/2006 |
| JP | 2007-525004 | 8/2007 |
| JP | 2008-103737 A | 5/2008 |
| JP | 2009-094494 A | 4/2009 |
| JP | 2010-003910 A | 1/2010 |
| JP | 2011-100994 A | 5/2011 |
| JP | 2011-171702 A | 9/2011 |
| WO | WO-2004/114391 | 12/2004 |
| WO | WO-2011/043194 | 4/2011 |
| WO | WO-2011/052396 | 5/2011 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-26106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(56) References Cited

OTHER PUBLICATIONS

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283, Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clarks et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

(56) References Cited

OTHER PUBLICATIONS

Naito.T et al., "World's first monolithic 3D-FPGA with TFT SRAM over 90nm 9 layer Cu CMOS", 2010 Symposium on VLSI Technology: Digest of Technical Papers, Jun. 15, 2010, pp. 219-220.

\* cited by examiner

○ Switching Element

SEMICONDUCTOR DEVICE AND METHOD OF DRIVING SEMICONDUCTOR DEVICE

BACKGROUND OF THE INVENTION

1. Field of the Invention

The present invention relates to a programmable semiconductor device.

2. Description of the Related Art

In semiconductor integrated circuits such as a normal central processing unit (CPU), circuit design is fixed and cannot be changed after manufacturing. In contrast, in semiconductor integrated circuits called programmable logic devices (PLDs), since a logic circuit is composed of an adequate number of logic cells and the logic cells can be interconnected by an electric switch (a programming unit or a switch), interconnections between the logic cells can be changed as needed after manufacturing (see Patent Documents 1 and 2).

Thus, since circuit configurations can be changed by users, PLDs have high versatility and allow great reductions in time and cost spent on circuit design and development.

One of techniques competing with a PLD technique is a gate array. This is an approach by which, over a wafer, components examples of which are standard logic elements such as NAND gates and NOR gates, transistors, and passive elements such as resistors are placed at predefined positions and a metal wiring layer is formed thereover to connect the components to each other, thereby completing a semiconductor circuit. This approach differs from a PLD technique in that connections between components are formed by a metal wiring.

Thus, to complete a semiconductor device by a gate array, only a mask for a metal wiring is ordered and a metal wiring layer is formed using this mask. Although circuit configurations cannot be changed after a semiconductor device is completed, a gate array has been more widely used than a PLD technique because a gate array requires a comparatively smaller amount of investment in small-quantity production and the like.

In recent years, however, as circuit line width is decreased, a gate array has not paid unless considerable quantity of production can be expected, because masks for metal wirings become much more expensive. Therefore, in a gate array, circuit line width has not fallen below 130 nm for the last few years.

In contrast, in PLDs, in which circuits are composed of electric programming units, circuit line width has been 40 nm or less because masks are not required. Further, a PLD technique needs a smaller amount of investment than a gate array. Accordingly, even semiconductor devices that would have been manufactured by a gate array in conventional cases began to be manufactured by a PLD technique.

REFERENCES

[Patent Document 1] United States Patent Application Publication No. 2011/0175646
[Patent Document 2] U.S. Pat. No. 6,172,521
[Patent Document 3] U.S. Pat. No. 7,772,053
[Patent Document 4] U.S. Pat. No. 7,674,650
[Patent Document 5] United States Patent Application Publication No. 2011/0058116
[Patent Document 6] United States Patent Application Publication No. 2011/0101351

SUMMARY OF THE INVENTION

PLDs includes complex PLDs (CPLDs), field programmable gate arrays (FPGAs), and the like. In any of the PLDs, a circuit configuration is determined by interconnections between logic cells which are stored in a semiconductor memory such as an EEPROM or an SRAM.

Depending on the circuit configuration which is programmed, there can be a case where a logic cell does not contribute to the circuit configuration. In particular, since the number of logic cells increases in a PLD having a larger size and higher versatility, setting a circuit configuration for a specific use (performing a configuration) increases the number of logic cells which do not contribute to the circuit structure.

Further, chip area is large relative to the scale of logic cells due to the large area of a semiconductor memory circuit such as an EEPROM (or a NOR flash memory) or an SRAM. For example, an FPGA using a 40-nm generation SRAM and a gate array using a 130-nm generation SRAM have almost the same chip area when the FPGA and the gate array have the same number of logic cells.

Furthermore, in PLDs, power supply voltage is supplied also to the logic cells which do not contribute to a circuit configuration, and accordingly, unnecessary power consumption occurs in logic cells due to leakage current or off-state current. For example, in the case where an inverter is formed using a CMOS, although, ideally, power is not consumed in a steady state, power is consumed in practice due to leakage current which flows to a gate insulating film or to off-state current which flows between a source and a drain.

In the case where a CMOS inverter is formed using bulk silicon, an off-state current of approximately 1 pA is generated at room temperature with a power supply voltage of approximately 2 V. When higher integration of a PLD is achieved, power consumption is further increased due to miniaturization of a semiconductor element, an increase in the number of elements, and the like.

In the case where a rewritable PLD is used, an EEPROM or an SRAM is generally used as a programming unit for storing a structure of interconnections. However, since the EEPROM writes and erases data utilizing the principle of tunneling current, deterioration of an insulating film easily occurs.

Accordingly, in practice, the number of times of rewriting data is not infinite, and the upper limit of the number of rewritings is approximately tens of thousands of times to hundreds of thousands of times. In addition, an absolute value of the voltage applied to the EEPROM when data is written and when data is erased is as high as around 20 V. Therefore, power consumption easily increases when data is written and when data is erased. In addition, a redundant circuit design for covering such a high operating voltage is necessary, and a very long time period is necessary for writing or erasing data. Therefore, the EEPROM is not suitable for uses involving frequent configurations.

Further, in the SRAM, power supply voltage always needs to be supplied so that data can be held. Although conventional SRAMs have less power consumption than DRAMs, recently SRAMS have consumed more power than DRAMs. This is because of short-channel effects and a reduction in threshold in response to a reduction in power supply voltage.

Accordingly, power is consumed even in a steady state while power supply voltage is supplied, as described above; therefore, if the number of programming units using the SRAM increases with higher integration, power consumption of a semiconductor device increases.

In view of the above problems, it is an object of the present invention to provide a semiconductor device which can reduce power consumption. It is another object of the present invention to provide a highly reliable semiconductor device using a programming unit. It is still another object of the present invention to provide a highly integrated semiconductor device. It is another object of the present invention to provide a semiconductor device having a novel structure. It is still another object of the present invention to provide a novel method of driving a semiconductor device. In accordance with one embodiment of the present invention, at least one of these objects can be achieved.

In a semiconductor device of one embodiment of the present invention, in accordance with changing of a structure of connections between logic cells (performing a configuration), supply of power supply voltage to the logic cells is also changed. In other words, when changing of the structure of connections between the logic cells generates a logic cell which does not contribute a circuit configuration, supply of power supply voltage to the logic cell in question is stopped.

In accordance with one embodiment of the present invention, supply of power supply voltage to the logic cells and a connection between the logic cells are controlled by a programming unit formed using an insulated gate field-effect transistor (hereinafter simply referred to as transistor) having an extremely small amount of off-state current or leakage current.

Here, the programming unit includes a first switching element, a second switching element, and a capacitor; the first switching element includes a connecting point of logic cells or of a logic cell and a power supply and is controlled by charge in the capacitor; and the second switching element has a function of accumulating configuration data into the capacitor and holding the data.

In accordance with one embodiment of the present invention, a semiconductor device includes a memory region including a memory element such as a DRAM, which includes a capacitor and a transistor and stores data by accumulating charge into the capacitor, and a logic circuit region where logic cells are arranged in a matrix. The semiconductor device has a structure in which data as to a circuit connection (configuration data) is periodically transmitted from the memory region to a programming unit in the logic circuit region, and the programming unit controls a connection between logic cells and supply of power supply voltage to the logic cells in accordance with the configuration data. The programming unit includes a first switching element, a second switching element, and a capacitor; the first switching element includes a connecting point of logic cells or of a logic cell and a power supply and is controlled by charge in the capacitor; and the second switching element has a function of accumulating the configuration data into the capacitor and holding the data.

As a semiconductor used for the first switching element, it is possible to use silicon, germanium, gallium arsenide, gallium phosphide, indium phosphide, or the like, which may be single crystal or polycrystalline.

As a transistor used for the second switching element, a transistor having a longer channel length or a narrower channel width than a normal transistor may be used. For example, the off-state current of a transistor, which has a channel length that is ten times as long as that of a normal transistor, can be one-tenth that of the normal transistor. In addition, the off-state current can be one hundredth that of the normal transistor when a short-channel effect can be prevented. The same can be applied to the case of a transistor having a channel width that is one-tenth that of the normal transistor. The off-state current of the transistor can be reduced also with a thinner semiconductor layer (see Patent Document 3).

A channel formation region of the transistor may include a semiconductor material which has a wider band gap than a silicon semiconductor and lower intrinsic carrier density than silicon. A semiconductor material having such characteristics is included in the channel formation region, whereby the amount of the off-state current of the transistor can be extremely small.

As examples of such a semiconductor material, an oxide semiconductor having a band gap which is approximately three times as large as that of silicon can be given (see Patent Documents 1 and 4 to 6).

In one embodiment of the present invention, a transistor having an extremely small amount of off-state current or leakage current as described above is preferably used for the programming unit for controlling a connection between the logic cells. Note that a normal transistor may be used in the case where a driving method in which data is periodically written to a programming unit (dynamic configuration) is performed.

Unless otherwise specified, in the case of an n-channel (a p-channel) transistor, the term off-state current in this specification means a current that flows between a source and a drain when the potential of a gate is less than or equal to 0 V with the potential of the source as a reference potential while the potential of the drain is higher (lower) than those of the source and the gate.

Specifically, the above programming unit includes at least the first switching element for controlling a connection between two nodes and the second switching element for controlling the above first switching element. The first switching element includes one or more transistors.

The second switching element preferably includes one or more of a transistor having a longer channel length than a normal transistor as described above, a transistor having an extremely thin semiconductor layer (having a thickness of 2 nm or less), and a transistor having a channel formation region including a semiconductor material such as an oxide semiconductor which has a band gap about two or more times as large as that of silicon. In the second switching element, the amount of the off-state current or leakage current of the transistor is extremely small.

One of a source and a drain of at least one transistor included in the second switching element is connected to a gate of at least one transistor included in the first switching element. Thus, with the transistor with an extremely small amount of off-state current or leakage current in the second switching element, the potential of the gate of the transistor included in the first switching element is held for a long period.

A period during which the potential of the gate of the transistor included in the first switching element is held is determined in accordance with a semiconductor device and may be 100 milliseconds or less, one day or more, or ten years or more. Thus, the off-state current of the transistor in the second switching element can be determined in accordance with the necessary period.

Note that an oxide semiconductor is a metal oxide exhibiting semiconductor characteristics. An oxide semiconductor highly-purified (purified OS) by reduction in the concentration of impurities such as moisture or hydrogen, which serves as electron donors (donors), is an intrinsic (i-type) semiconductor or a substantially intrinsic semiconductor.

Therefore, a transistor including such an oxide semiconductor has an extremely small amount of off-state current or leakage current.

Specifically, the hydrogen concentration in the highly-purified oxide semiconductor which is measured by secondary ion mass spectrometry (SIMS) is less than or equal to $5\times10^{19}/cm^3$, preferably less than or equal to $5\times10^{18}/cm^3$, more preferably less than or equal to $5\times10^{17}/cm^3$, still more preferably less than or equal to $1\times10^{16}/cm^3$.

In addition, the carrier density of an oxide semiconductor film, which can be measured by Hall effect measurement, is less than $1\times10^{14}/cm^3$, preferably less than $1\times10^{12}/cm^3$, more preferably less than $1\times10^{11}/cm^3$. Furthermore, the band gap of the oxide semiconductor is greater than or equal to 2 eV, preferably greater than or equal to 2.5 eV, more preferably greater than or equal to 3 eV. With the use of the oxide semiconductor film which is highly purified by sufficiently reducing the concentration of impurities such as moisture or hydrogen, the amount of the off-state current or leakage current of the transistor can be reduced.

The analysis of the hydrogen concentration in the oxide semiconductor film is described here. It is known that it is, in principle, difficult to obtain data accurately in the proximity of a surface of a sample or in the proximity of an interface between stacked films formed using different materials by the SIMS analysis. Thus, in the case where distributions of the hydrogen concentrations of the film are analyzed by SIMS in thickness directions, when, in a region of the film under study, the value does not vary greatly and an almost constant value can be obtained, an average value is accepted as the hydrogen concentration.

Further, in the case where the thickness of the film under study is small, a region with an almost constant value can sometimes not be obtained due to the influence of the hydrogen concentration in adjacent films. In that case, a local maximum value or a local minimum value of the hydrogen concentration in a region of the film is accepted as the hydrogen concentration in the film. Furthermore, in the case where a mountain-shaped peak having the local maximum value and a valley-shaped peak having the local minimum value do not exist in the region where the films are provided, the value at an inflection point is accepted as the hydrogen concentration.

Various experiments can actually prove a small amount of off-state current of the transistor including the highly-purified oxide semiconductor film as an active layer. For example, with an element with a channel width of $1\times10^6$ mm and a channel length of 10 μm, in a range of from 1 V to 10 V of the potential difference between a source and a drain, it is possible that the amount of off-state current (which is drain current in the case where the potential difference between the gate and the source is 0 V or less) is less than or equal to the measurement limit of a semiconductor parameter analyzer, that is, less than or equal to $1\times10^{-13}$ A.

In that case, it can be found that an off-state current density corresponding to a value obtained by dividing the off-state current by the channel width of the transistor is less than or equal to 100 zA/μm. Further, in the experiment, a capacitor and a transistor (the thickness of a gate insulating film was 100 nm) were connected to each other and a circuit in which charge flowing into or from the capacitor was controlled by the transistor was used. When the highly-purified oxide semiconductor film was used as a channel formation region in the transistor, and the amount of the off-state current of the transistor was measured from a change in the amount of charge of the capacitor per unit time, it was found that in the case where the potential difference between the source and drain of the transistor was 3 V, a smaller amount of off-state current of 10 zA/μm to 100 zA/μm was able to be obtained.

Therefore, in the semiconductor device in accordance with one embodiment of the present invention, the off-state current density of the transistor including the highly-purified oxide semiconductor film as an active layer can be less than or equal to 100 zA/μm, preferably less than or equal to 10 zA/μm, or more preferably less than or equal to 1 zA/μm, depending on the potential difference between the source and the drain. Accordingly, the transistor including the highly-purified oxide semiconductor film as an active layer has a much smaller amount of off-state current than a transistor including silicon having crystallinity. When a transistor having such a small amount of off-state current is used for the second switching element, charge can be held for one day or more.

A transistor including a highly-purified oxide semiconductor shows almost no temperature dependence of off-state current. This is because an impurity serving as an electron donor (donor) in the oxide semiconductor is removed and the oxide semiconductor is highly purified, so that a conductivity type is close to a substantially intrinsic type and the Fermi level is located in the center of the forbidden band.

This also results from the fact that the oxide semiconductor has an energy gap greater than or equal to 3 eV and includes very few thermally excited carriers. In addition, the source and the drain are in a degenerated state, which is also a factor for showing no temperature dependence. The transistor is mainly operated with carriers which are injected from the degenerated source to the oxide semiconductor.

As the oxide semiconductor, a quaternary metal oxide such as an In—Sn—Ga—Zn-based oxide semiconductor, a ternary metal oxide such as an In—Ga—Zn-based oxide semiconductor, an In—Sn—Zn-based oxide semiconductor, an In—Al—Zn-based oxide semiconductor, a Sn—Ga—Zn-based oxide semiconductor, an Al—Ga—Zn-based oxide semiconductor, and a Sn—Al—Zn-based oxide semiconductor, or a binary metal oxide such as an In—Zn-based oxide semiconductor, a Sn—Zn-based oxide semiconductor, an Al—Zn-based oxide semiconductor, a Zn—Mg-based oxide semiconductor, a Sn—Mg-based oxide semiconductor, an In—Mg-based oxide semiconductor, an In—Ga-based oxide semiconductor, an In-based oxide semiconductor, a Sn-based oxide semiconductor, and a Zn-based oxide semiconductor, and the like can be used.

Note that in this specification, for example, an In—Sn—Ga—Zn-based oxide semiconductor means a metal oxide including indium (In), tin (Sn), gallium (Ga), and zinc (Zn). There is no particular limitation on the stoichiometric composition ratio. The above oxide semiconductor may include silicon.

Alternatively, as the oxide semiconductor, an oxide semiconductor can be represented by the chemical formula, $InMO_3(ZnO)_m$ (m>0) may be used. Here, M represents one or more metal elements selected from Ga, Al, Mn, and Co.

The above explanation is one aspect of an oxide semiconductor suitable for application of the present invention, and details of the oxide semiconductor and its preparation method and the like can be found in Patent Documents 1 and 4 to 6.

A programming unit applicable to one embodiment of the present invention includes the capacitor one of the electrodes of which is connected to a gate of a first transistor, and the potential of the other of the electrodes of the capacitor is different during programming (configuration) and during a circuit operation.

A programming unit applicable to one embodiment of the present invention includes, as the first switching element, one n-channel transistor, one p-channel transistor, or one transfer gate circuit (analog switch).

A programming unit applicable to one embodiment of the present invention includes, as the second switching element, an n-channel transistor having a threshold of 0 V or less or a p-channel transistor having a threshold of 0 V or more.

In accordance with one embodiment of the present invention, supply of power supply voltage to a logic cell which does not contribute to a circuit configuration is stopped by the programming unit, so that power consumption of the semiconductor integrated circuit can be reduced.

The programming unit having any of the above structures can suppress degradation of a gate insulating film by tunneling current, as compared to a conventional programming unit using an EEPROM; accordingly, a semiconductor device in which the number of times of rewriting data can increase can be provided.

An area needed to form the programming unit having any of the above structures is sufficiently smaller than that in a conventional programming unit using an SRAM or EEPROM; accordingly, circuit integration can be achieved. In particular, when formed using a thin film transistor, the second switching element can be formed above the logic cells; accordingly the area can further be reduced.

In one embodiment of the present invention, a dynamic reconfiguration is possible, and therefore a circuit with a limited number of logic cells can achieve substantially the same level of function as with at least several times more logic cells.

In the programming unit having the above structure, the operating voltage which is needed for writing of data on a connection state is approximately determined by the operating voltage of the second transistor. Accordingly, it is possible to provide a semiconductor device in which the above operating voltage can be reduced significantly and power consumption is reduced compared to a semiconductor device having a conventional programming unit using an EEPROM.

Unlike a programming unit formed using an SRAM, the programming unit having the above structure holds data using a transistor having an extremely small amount of off-state current; accordingly, a connection state can be held to some extent even when power supply voltage is not always supplied to the programming unit. Thus, a semiconductor device in which power consumption is reduced can be provided.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be changed in various ways without departing from the spirit and scope of the present invention. Accordingly, the present invention should not be construed as being limited to the description of the embodiments below.

Note that a semiconductor device of the present invention includes, in its category, various semiconductor integrated circuits formed using semiconductor elements such as microprocessors, image processing circuits, controllers for semiconductor display devices, digital signal processors (DSPs), micro controllers, and the like. In addition, the semiconductor device of the present invention also includes, in its category, various devices such as RF tags formed using the above semiconductor integrated circuits, semiconductor display devices, and the like. The semiconductor display devices include, in its category, liquid crystal display devices, light-emitting devices in which a light-emitting element typified by an organic light-emitting element (OLED) is provided for each pixel, electronic paper, digital micromirror devices (DMDs), plasma display panels (PDPs), field emission displays (FEDs), and other semiconductor display devices in which a semiconductor element is included in a driver circuit.

(Embodiment 1)

In this embodiment, a structure and an operation of a semiconductor device of one embodiment of the present invention will be described.

Figure 1:
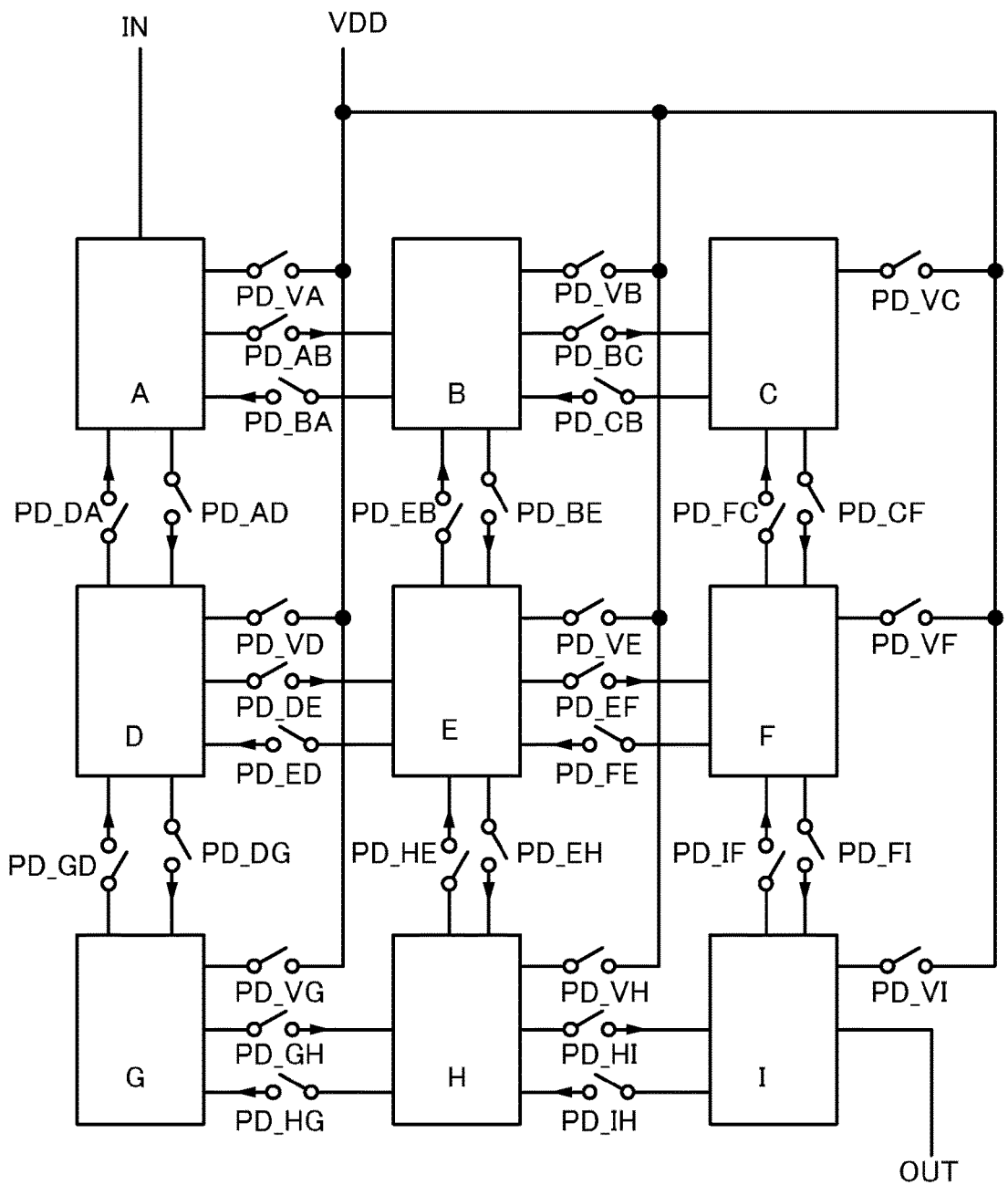
FIG. 1 is a diagram illustrating a structure of a semiconductor device.

A structure of a semiconductor device of one embodiment of the present invention is illustrated in FIG. 1, as an example. The semiconductor device illustrated in FIG. 1 is provided with nine logic cells A to I, programming units PD_AB to PD_IH configured to control connections between the logic cells A to I, and programming units PD_VA to PD_VI configured to control the supply of a high power supply potential VDD to the logic cells A to I.

Note that in FIG. 1, a programming unit configured to control a connection between an output terminal of the logic cell A and an input terminal of the logic cell B is denoted as PD_AB, for example. On the other hand, a programming unit configured to control a connection between an output terminal of the logic cell B and an input terminal of the logic cell A is denoted as PD_BA.

In FIG. 1, in order to avoid complexity of description, the case in which each of the nine logic cells is connected to the logic cell of up, down, left, or right via the programming units is illustrated. However, one embodiment of the present invention is not limited to this structure, and a designer can set the number of logic cells and the structure of the connection, as appropriate.

In FIG. 1, each logic cell is connected via the programming unit to a node to which the high power supply potential VDD is applied; however, in practice, not only the high power supply potential VDD but also a fixed potential which is different from the high power supply potential VDD, such as a low power supply potential VSS, are applied to each logic cell. That is, when the high power supply potential VDD is applied to the logic cells, the potential difference between the high power supply potential VDD and the low power supply potential VSS is supplied to the logic cells as a power supply voltage.

FIG. 1 illustrates the case where one output terminal of a given logic cell is connected to one input terminal of another logic cell via the programming unit. However, one embodiment of the present invention is not limited to this structure. One output terminal of a given logic cell may be connected to a plurality of input terminals of another logic cell via programming units.

Note that there is no particular limitation on the structure of a logic circuit used as the logic cell. A logic circuit which performs a simple logic operation such as an inverter, an AND, a NAND, or a NOR, an adder, a multiplier, a memory (e.g., a DRAM or the SRAM), or various arithmetic units can be used as the logic cell.

Each programming unit includes at least a first transistor (Tr1) which controls a connection between two nodes and a second transistor (Tr2) which controls the supply of a potential to a gate of the first transistor. Specifically, structural examples of the programming units are illustrated in FIGS. 2A to 2D.

Figure 2A:
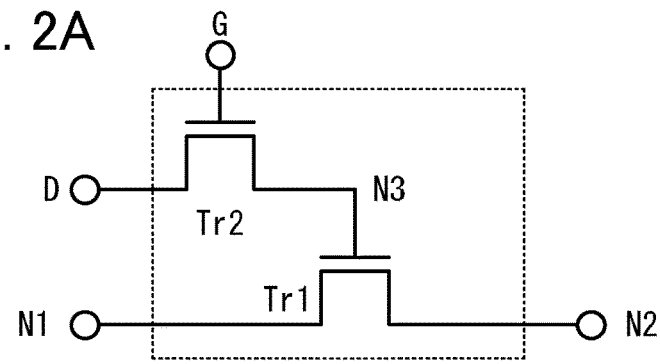
FIGS. 2A to 2D each illustrate a circuit diagram of a programming unit.

FIG. 2A is an example of the programming unit having the simplest structure, which includes the first transistor Tr1 configured to control a connection between two nodes (a first node N1 and a second node N2) and the second transistor Tr2 configured to control the supply of a potential to a gate of the first transistor Tr1 (third node N3). Specifically, a source of the first transistor Tr1 is connected to the first node N1 and a drain of the first transistor Tr1 is connected to the second node N2.

Further, one of the source and drain of the second transistor Tr2 is connected to the gate of the first transistor Tr1 (third node N3), and a potential for controlling switching of the first transistor Tr1 is applied to the other of the source and drain of the second transistor Tr2 (terminal D).

Figure 2B:
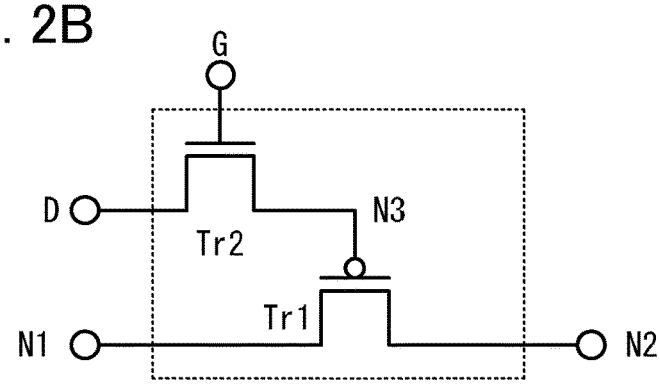
Figure 2C:
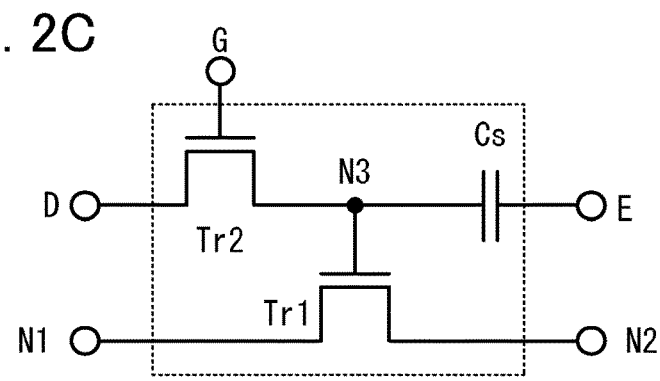
Figure 2D:
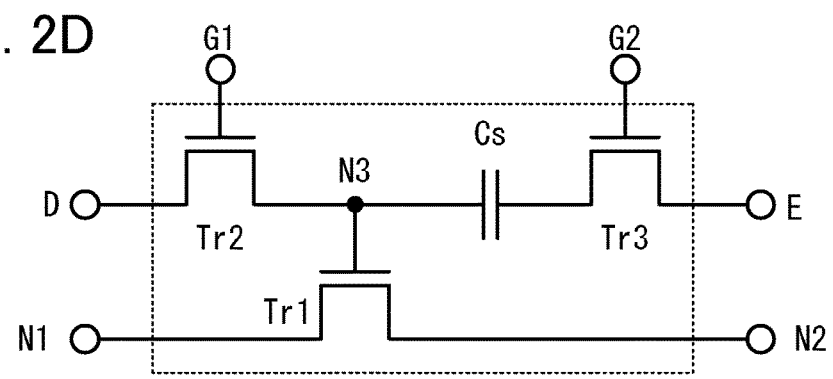

As illustrated in FIG. 2B, the second transistor Tr2 may be a p-channel transistor. As illustrated in FIG. 2C, a capacitor Cs for holding the potential of the gate of the first transistor Tr1 may be provided. As illustrated in FIG. 2D, a third transistor Tr3 may be provided on a counter electrode side of the capacitor so that the potential of a terminal E is prevented from affecting the potential of the third node N3 during a configuration.

When the second transistor Tr2 is turned on in accordance with a potential input to a gate of the second transistor Tr2 (i.e., terminal G), a potential for controlling switching of the first transistor Tr1 is applied to the third node N3. The first transistor Tr1 performs switching in accordance with the potential applied to the third node N3. When the first transistor Tr1 is on, the first node N1 is connected to the second node N2. In contrast, when the first transistor Tr1 is off, the first node N1 is not connected to the second node N2.

When the second transistor Tr2 is turned off in accordance with a potential input to the gate of the second transistor Tr2 (i.e., terminal G), the third node N3 is in a floating state, and the potential is held. Thus, a connection state or a disconnection state between the first node N1 and the second node N2 is held. In this way, the first node N1 and the second node N2 can be connected or disconnected depending on the potential of the third node N3.

In the case of a programming unit for controlling a connection between the logic cells, the first node N1 is connected to an input terminal or an output terminal of one logic cell, and the second node N2 is connected to an input terminal or an output terminal of another logic cell. In the case of a programming unit for controlling supply of power supply voltage to the logic cell, the logic cell is connected to one of the first node N1 and the second node N2, and the high power supply potential VDD is applied to the other of the first node N1 and the second node N2.

In accordance with one embodiment of the present invention, in each of the programming units illustrated in FIGS. 2A to 2D, the amount of the off-state current or leakage current of the second transistor Tr2 is so small as to satisfy a need. Here, the necessary amount of the off-state current or leakage current is determined by a period during which data is held and the capacitance of the capacitor (or a component corresponding to the capacitor).

For example, in order that data can be held for 10 days or more with a capacitance of 0.01 fF, the sum of the amounts of the off-state current and the leakage current needs to be 0.01 zA or less; when the period during which the data is held is 1 second or less with a capacitance of 100 fF, the sum of the amounts of the off-state current and the leakage current can be as high as 10 fA.

For example, a channel formation region of the second transistor Tr2 may include a semiconductor material whose band gap is wider than that of a silicon semiconductor and whose intrinsic carrier density is lower than that of silicon. When a semiconductor material having such characteristics is included in the channel formation region, a transistor having an extremely small amount of off-state current can be realized. Further, the second transistor Tr2 may have a longer channel length than a normal transistor. Alternatively, an extremely thin semiconductor layer may be used.

Examples of a semiconductor material whose band gap is wider than that of a silicon semiconductor and whose intrinsic carrier density is lower than that of silicon area compound semiconductor such as silicon carbide (SiC) or gallium nitride (GaN), an oxide semiconductor including a metal oxide such as zinc oxide (ZnO), and the like.

In particular, the film formation temperature of an oxide semiconductor is normally as low as 300° C. to 500° C. (at the maximum, approximately 800° C.), and a semiconductor element including an oxide semiconductor can be stacked over an integrated circuit formed using a semiconductor material such as single crystal silicon.

Further, an oxide semiconductor can accompany an increase in the size of a substrate. Therefore, among the above wide band-gap semiconductors, particularly, an oxide semiconductor has an advantage of high mass production efficiency. In addition, a crystalline oxide semiconductor having a superior performance (e.g., higher field-effect mobility) can be easily obtained by a heat treatment at temperatures comprised between 450° C. and 800° C.

When an oxide semiconductor is used for the second transistor Tr2, it is preferable that the oxide semiconductor have a band gap greater than or equal to 3 eV, and a carrier density less than $10^{12}/cm^3$, preferably, less than $10^{11}/cm^3$. It is also preferable that the hydrogen concentration in the above oxide semiconductor, which is measured by SIMS, be less than or equal to $5 \times 10^{19}/cm^3$, preferably less than or equal to $5\times10^{18}/cm^3$, more preferably less than or equal to $5\times10^{17}/cm^3$, still more preferably less than or equal to $1\times10^{16}/cm^3$. When an oxide semiconductor having such characteristics is used, the amount of the off-state current or leakage current of the second transistor Tr2 can be reduced.

The gate insulating film of the second transistor Tr2 preferably has a thickness greater than or equal to 1 nm, more preferably greater than or equal to 10 nm. The channel length of the second transistor Tr2 is preferably greater than or equal to 30 nm, more preferably greater than or equal to 300 nm. When such a structure is adopted, the amount of the off-state current or leakage current of the second transistor Tr2 can be reduced.

Thus, when the second transistor Tr2 with a remarkably small amount of off-state current or leakage current is used, the supply of a potential to the third node N3 is controlled, whereby the potential of the third node N3 is held constant for a long time. Therefore, the connection state between the first node N1 and the second node N2 can also be held for a long time.

In order to further reduce the off-state current or leakage current of the second transistor Tr2 when the connection state is held, the potential of the third node N3 is preferably set as appropriate.

A channel formation region of the first transistor Tr1 may include a semiconductor material whose band gap is wider than that of a silicon semiconductor and whose intrinsic carrier density is lower than that of silicon, or may include a semiconductor material which has higher mobility. Suitable examples of a semiconductor material having high mobility are polycrystalline or single crystal materials having crystallinity such as germanium, silicon, and silicon germanium, single crystal silicon carbide, and the like.

In the case of a semiconductor material whose band gap is wider than that of a silicon semiconductor and whose intrinsic carrier density is lower than that of silicon, the first transistor Tr1 has a small amount of off-state current or leakage current like the second transistor Tr2, and accordingly power consumption of the semiconductor device can be further reduced.

In the case of a semiconductor material which has higher mobility, the mobility of the first transistor Tr1 is high and accordingly resistance between the nodes connected with the first transistor Tr1 can be reduced. In particular, in the case of the programming unit for controlling a connection between the logic cells, high connection resistance between the logic cells leads to a decrease in operating speed of the semiconductor device. Therefore, in the case of the programming unit for controlling a connection between the logic cells, the structure using a semiconductor material which has higher mobility is preferred.

Note that when the channel formation region of the first transistor Tr1 includes a semiconductor material which has higher mobility, the physical thickness of the gate insulating film is preferably 2 nm or more in order to reduce the off-state current or leakage current.

Further, when a period during which data is held is 1 day or more, the physical thickness of the gate insulating film is preferably 4 nm or more. When the period during which data is held is 10 years or more, the physical thickness of the gate insulating film is preferably 7 nm or more.

In any case, the first transistor Tr1 may be formed using a thin film of a semiconductor (a semiconductor film) or a bulk semiconductor (e.g., a semiconductor wafer).

Note that when the channel formation regions of both the transistors include the same semiconductor material, the first transistor Tr1 may be formed in the same layer as the second transistor Tr2.

In that case, the thickness of the gate insulating film of the first transistor Tr1 is the same as that of the second transistor Tr2 in design; however, the channel length or channel width of the first transistor Tr1 may be different from that of the second transistor Tr2. For example, when on-state resistance of the first transistor Tr1 is desired to be lower, the channel width may be twice or more as large as that of the second transistor Tr2, preferably five or more times as large as that of the second transistor Tr2.

Further, the first transistor Tr1 may be formed by a non-self-aligned method. Although parasitic capacitance occurs due to overlap of the gate and the source or drain by a non-self-aligned method, since high speed switching is not required for the first transistor Tr1, such parasitic capacitance does not become a problem. Instead, the parasitic capacitance functions as the capacitor (Cs) which holds the potential of the gate of the first transistor Tr1. On the other hand, the parasitic capacitance of the second transistor Tr2 is preferably low in order to prevent generation of a change in the potential of the third node N3 in switching.

Even when the same semiconductor material as that of the transistor which forms a logic cell is used for the first transistor Tr1, the thickness of the gate insulating film is preferably larger than that of the gate insulating film of the transistor which forms the logic cell, in order to reduce leakage current of the first transistor Tr1. In that case, it is possible that the first transistor Tr1 is formed by a non-self-aligned method and an electrically conductive film formed in a layer which is different from that of the transistor used for the logic cell is used as the gate of the first transistor Tr1.

When at least one of the first transistor Tr1 and the second transistor Tr2 is formed using a semiconductor film, the transistor or transistors formed using a semiconductor film may have a gate only on one side of the semiconductor film or may also have a back gate on the opposite side of the semiconductor film so that the semiconductor film is interposed between the gate and the back gate. In that case, the back gate may be electrically insulated to be in a floating state, or may be in a state in which the back gate is supplied with a potential from another element. In the latter case, the gate may be electrically connected to the back gate, or only the back gate may be always supplied with a suitable fixed potential. The level of the potential applied to the back gate is controlled, whereby the threshold of the transistor can be controlled.

The programming unit which can be used for the semiconductor device is not limited to the circuits illustrated in FIGS. 2A to 2D. The programming unit includes at least one or more first transistors for controlling a connection between two nodes and one or more second transistors for controlling the supply of a potential to the gate of the first transistor.

The semiconductor device illustrated in FIG. 1 is in a state where a connection between all the logic cells is cut and supply of power supply voltage to all the logic cells is stopped. From the state illustrated in this FIG. 1, some of the programming units can be turned on to connect the logic cells so that a necessary circuit can be formed.

Note that the time required to perform a configuration (build a circuit by controlling switching of the programming units) is short enough to be ignored, as long as a circuit structure as illustrated in FIG. 1 is used, depending on the scale of a matrix formed using the logic cells and the programming units, the mobility of transistors used for the programming units, and the like. For example, the above time required per row of logic cells (e.g., one row of logic cells A to C) is less than or equal to 100 nanoseconds.

In this embodiment, supply of power supply voltage to the logic cell which does not contribute to a circuit configuration is stopped, which can decrease power consumption of the semiconductor device. In particular, when the semiconductor device has a channel length less than or equal to 50 nm, since the thickness of the gate insulating film is several nanometers or less and off-state current between source and drain and leakage current flowing through the gate insulating film account for the substantial amount of the power consumption, the above structure is effective in decreasing power consumption.

In this embodiment, the connection between the logic cells is controlled by a transistor having an extremely small amount of off-state current or leakage current, so that it is possible to reduce leakage current or off-state current flowing between the logic cell to which power supply voltage is applied and the logic cell to which power supply voltage is not applied, thereby reducing power consumption of a semiconductor device.

With the programming unit having the above structure, degradation of the gate insulating film in the programming unit due to tunneling current can be suppressed when compared to that in a conventional programming unit using an EEPROM. Hence, a semiconductor device capable of rewriting data an infinite number of times can be provided.

In the programming unit having the above structure, the operating voltage which is needed for writing of data is approximately determined by the operating voltage of the second transistor Tr2. Hence, a semiconductor device in which this operating voltage can be significantly reduced and power consumption can be suppressed as compared to a conventional programming unit using an EEPROM can be provided.

Unlike a programming unit using an SRAM, the programming unit having the above structure can hold a connection state to some extent even when power supply voltage is not always supplied to the programming unit. In addition, data is held using a transistor with a remarkably small amount of off-state current. Hence, a semiconductor device in which power consumption can be reduced can be provided.

(Embodiment 2)

In this embodiment, an operation example in which the circuit in FIG. 2A is used as a programming unit is described. In the following explanation including this embodiment, although specific numerical values are given for easy understanding, implementation with other numerical values are not excluded. In addition, since a potential is relatively determined, an absolute value of a potential is not much important.

Here, the high power supply potential VDD and the low power supply potential VSS in the circuit illustrated in FIG. 1 are set to +2 V and 0 V, respectively. That is, the output potential of each logic cell illustrated in FIG. 1 changes in the range of 0 V to +2 V.

In that case, in order that the first node N1 and the second node N2 in the programming unit illustrated in FIG. 2A can be always in a connection state (in order that potentials of the first node N1 and the second node N2 can be prevented from limiting the connection state), the potential of the third node N3 needs to be equal to or above the sum of the threshold of the first transistor Tr1 and VDD.

When the threshold of the first transistor Tr1 is set to +0.5 V, the potential of the third node N3 is required to be +2.5 V or more. Actually, the potential of the third node N3 is preferably +3 V or more in order to sufficiently reduce the on-state resistance.

In the same way, in order that the first node N1 and the second node N2 in the programming unit can be always in a disconnection state, the potential of the third node N3 needs to be equal to or below the sum of the threshold of the first transistor Tr1 and VSS. Therefore, the potential of the third node N3 needs to be +0.5 V or less. Actually, the potential of the third node N3 is preferably 0 V or less in order to sufficiently increase the off-state resistance.

Therefore, the potential of the terminal D is set to 0 V or less or +3 V or more. Here, the potential of the terminal D is set to 0 V or +3 V. The first node N1 and the second node N2 in the programming unit are disconnected when the potential of the terminal D is 0 V, and the first node N1 and the second node N2 are connected when the potential of the terminal D is +3 V.

An operation of the second transistor Tr2 when the above conditions are employed for the terminal D is considered. In the case where the potential of the terminal D is +3 V, in order that the potential can be input to the third node N3, the potential of the gate of the second transistor Tr2 needs to be equal to or above the sum of +3 V and the threshold of the second transistor Tr2.

Figure 4A:
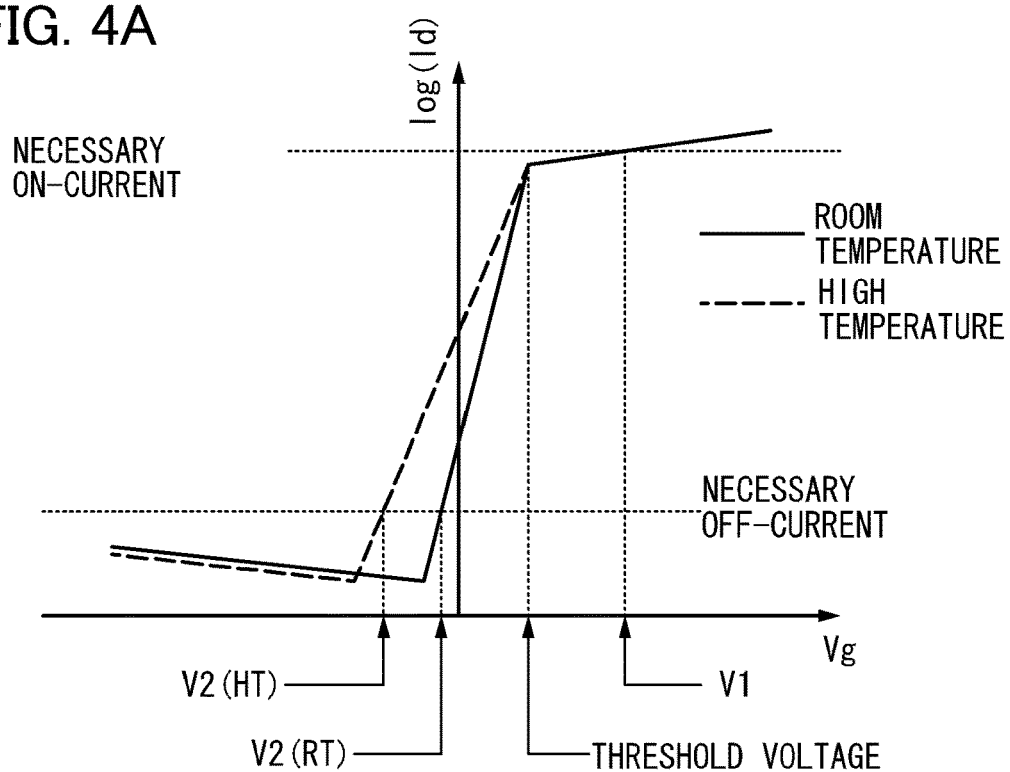
FIGS. 4A and 4B each illustrate characteristics of a transistor.

Incidentally, the threshold and off-state characteristics of the second transistor Tr2, which are important for understanding and implementation of the present invention, are described with reference to FIGS. 4A and 4B. FIG. 4A schematically shows the gate potential (Vg) dependence of the drain current (Id) on a general n-channel insulated gate transistor (the potential of the drain>the potential of the source=0 V).

In other words, when the gate potential is sufficiently lower than the potential of the source, the amount of the drain current less changes while remaining extremely small. Note that the amount of the drain current in this state is extremely small in the case where an intrinsic semiconductor having a band gap of 3 eV or more is used for the channel as described above.

When the gate potential exceeds a certain value and becomes high, the drain current rapidly increases. This state continues until the gate potential becomes a value in the vicinity of the threshold of the transistor. Such a region is referred to as subthreshold region. After the gate potential exceeds the vicinity of the threshold, the increase in drain current is gradual.

The second transistor Tr2 in the programming unit is required to have sufficiently high off-state resistance (i.e., a sufficiently small amount of off-state current) when data is held. On the other hand, when data is written to the programming unit, sufficiently low on-state resistance (sufficiently high on-state current) is required. The gate potential for obtaining the necessary on-state current is denoted by V1 in FIG. 4A.

In the following example, V1 is used to mean the same thing as a threshold on the assumption that on-state current needed for the second transistor Tr2 can be sufficiently obtained even when the potential of the gate is set to the threshold.

A period during which data is held by the programming unit is one millisecond to ten years, and writing of data is preferably performed for a period of ten nanoseconds to one millisecond. Under such conditions, the ratio of necessary on-state current to necessary off-state current (necessary on-state current/necessary off-state current) is $10^6$ to $10^{20}$, preferably $10^{14}$ to $10^{20}$.

As apparent from FIG. 4A, most part of the ratio of necessary on-state current to necessary off-state current changes within the subthreshold region. Therefore, such change in ratio is preferably obtained in the subthreshold region.

In general, considering the increase in drain current in the subthreshold region, a tenfold increase in drain current needs the potential of the gate to increase by 60 mV at room temperature (25° C.) for an ideal insulated gate transistor. The potential of the gate needs to increase more if there is a trap level or the like of the gate insulating film or a short-channel effect.

The potential of the gate also needs to increase more if there is a temperature increase. This tendency is proportional to absolute temperature; for example, at 95° C., a tenfold increase in drain current needs the potential of the gate to increase by 73 mV.

In consideration of the above, for example, to change the drain current by 14 orders of magnitude, the potential of the gate is required to change by 0.84 V at room temperature or by 1.02 V at 95° C. for an ideal insulated gate transistor. An actual insulated gate transistor requires a larger change than an ideal one; the potential of the gate is required to change by 1 V to 1.5 V at room temperature or by 1.2 V to 1.8 V at 95° C.

In other words, necessary off-state resistance (off-state current) requires the potential of the gate to be lower than the threshold by 1 V or more at room temperature or 1.2 V or more at 95° C. In FIG. 4A, V2 (RT) denotes gate potential for obtaining necessary off-state current at room temperature and V2 (HT) denotes gate potential for obtaining necessary off-state current at a high temperature (95° C.).

Incidentally, in a thin film transistor with a sufficiently long channel in which the thickness of an intrinsic semiconductor film is 30 nm or less and the silicon oxide equivalent thickness of a gate insulating film is 30 nm or less, the threshold is almost determined by the electron affinity of the semiconductor and the work function of the gate. For example, when the electron affinity of the semiconductor is 4.6 eV and the work function of the gate is 5.0 eV, the threshold is about +0.4 V.

Figure 4B:
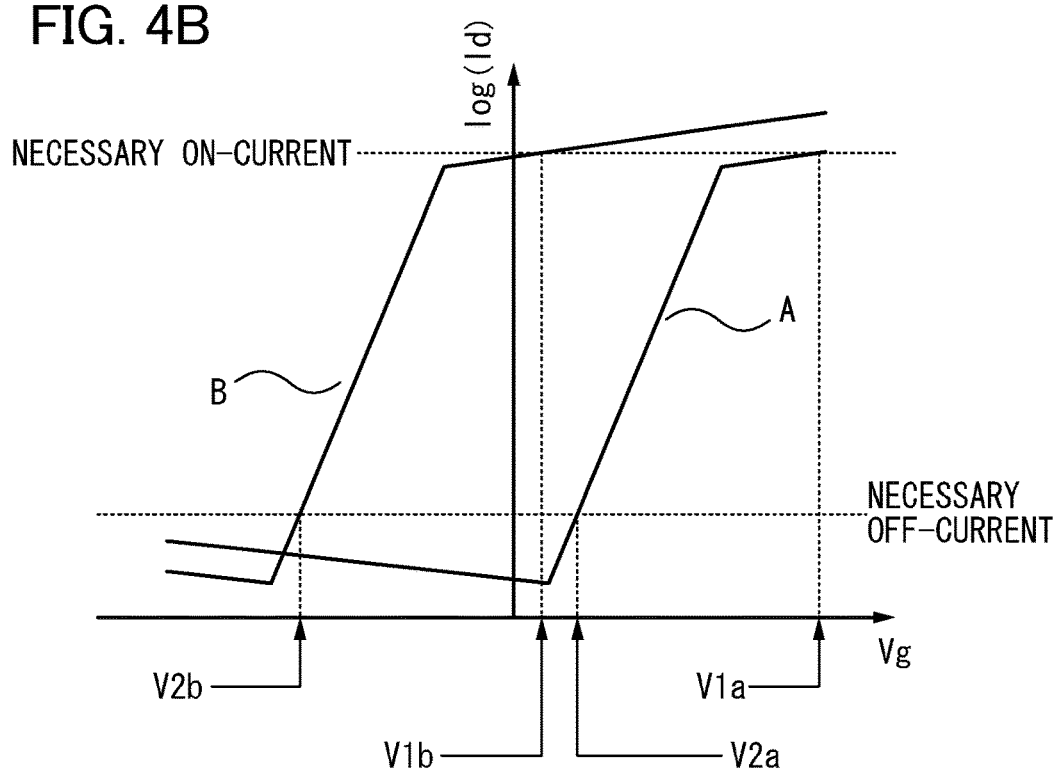

For example, in the case of a material having a work function of 4.1 eV (e.g., aluminum), the threshold is about −0.5 V (see the curve B in FIG. 4B); in the case of a material having a work function of 5.9 eV (e.g., osmium), the threshold is about +1.3 V (see the curve A in FIG. 4B). Here, in the latter case, necessary off-state current can be obtained at 95° C. when the threshold is +0.1 V (corresponding to V2a in FIG. 4B). Note that when influenced by a short-channel effect, the potential of the gate needs to be more reduced.

Operations at thresholds V1 of the second transistor Tr2 of +1.5 V, +0.5 V, and −0.5 V are each described below. In this embodiment and the subsequent embodiments, the potential V2 [V] of the gate, with which necessary off-state current (or off-state resistance) can be obtained, is (V1−1.5) [V] or less.

As described above, in the case where the potential of the terminal D is +3 V, the potential of the gate of the second transistor Tr2 (i.e., terminal G) needs to be equal to or above the sum of +3 V and the threshold of the second transistor Tr2 in order that the second transistor Tr2 can be turned on. Therefore, the potential of the terminal G needs to be [4.5+α] V when the threshold of the second transistor Tr2 is +1.5 V, the potential of the terminal G needs to be [3.5+α] V when the threshold is +0.5 V, and the potential of the terminal G needs to be [2.5+α] V when the threshold is −0.5 V.

Here, α is preferably 0 or more; as α is increased, writing of data is faster but the maximum potential necessary for the circuit naturally becomes higher and a load on the circuit also increases. However, unlike for a normal CPU or a memory, high speed is not particularly required for a programming unit as the one in this embodiment, depending on the case. Therefore, α may be 0, or α may be less than 0 depending on the case.

For example, with a mobility of a semiconductor of 10 cm$^2$/Vs, the drain current is about 1 μA where α=0, but time required for switching can be 100 nanoseconds or less. If the time required for switching can be one microsecond or more, α can be less than 0.

In the case where the potential of the terminal D is 0 V, the potential of the gate of the second transistor Tr2 (i.e., terminal G) for obtaining the off-state current needed to hold the potential of the terminal D in the third node N3 is required to be equal to or below the value obtained by subtraction of 1.5 V from the threshold of the second transistor Tr2. That is, the potential of the terminal G needs to be (0−β) [V] when the threshold is +1.5 V, the potential of the terminal G needs to be (−1−β) [V] when the threshold is +0.5 V, and the potential of the terminal G needs to be (−2−β) [V] when the threshold is −0.5 V. Here, β is preferably 0 or more.

In sum, in the case where the threshold of the second transistor Tr2 is set to +1.5 V, four potentials, i.e., VDD, VSS, the +3 V potential needed for the terminal D, and the greater than or equal to +4.5 V potential needed to turn on the second transistor Tr2, are necessary. Note that the less than or equal to potential 0 V needed to turn off the second transistor Tr2 can be replaced with VSS.

Further, the +3 V potential needed for the terminal D can also be replaced with the greater than or equal to +4.5 V potential needed to turn on the second transistor Tr2. In the case where such replacement is made, the necessary potentials are three. In the case where the potential of the terminal D is set to +4.5 V or more, the potential of the third node N3 is a potential (of +3 V or more) obtained by subtraction of the threshold of the second transistor Tr2 from the potential of the terminal D.

In the case where the threshold of the second transistor Tr2 is set to +0.5 V, five potentials, i.e., VDD, VSS, the +3 V potential needed for the terminal D, the greater than or equal to +3.5 V potential needed to turn on the second transistor Tr2, and the less than or equal to −1 V potential needed to turn off the second transistor Tr2, are necessary.

Further, the +3 V potential needed for the terminal D can be replaced with the greater than or equal to +3.5 V potential needed to turn on the second transistor Tr2. In the case where such replacement is made, the necessary potentials are four. In the case where the potential of the terminal D is set to +3.5 V or more, the potential of the third node N3 is a potential (of +3 V or more) obtained by subtraction of the threshold of the second transistor Tr2 from the potential of the terminal D.

In the case where the threshold of the second transistor Tr2 is set to −0.5 V, five potentials, i.e., VDD, VSS, the +3 V potential needed for the terminal D, the greater than or equal to +2.5 V potential needed to turn on the second transistor Tr2, and the less than or equal to −2 V potential needed to turn off the second transistor Tr2, are necessary.

Note that the greater than or equal to +2.5 V potential needed to turn on the second transistor Tr2 can be replaced with the +3 V potential needed for the terminal D. In the case where such replacement is made, the necessary potentials are four. In the case where the potential needed to turn on the second transistor Tr2 is set to +3 V and the potential of the terminal D is set to +3 V, the potential of the third node N3 is +3 V.

Thus, a higher potential (+3 V in the above example) of the potentials applied to the terminal D (+3 V and 0 V in the above example) can be replaced with the potential for turning on the second transistor Tr2. In the case where the threshold of the second transistor Tr2 is sufficiently high, the potential for turning off the second transistor Tr2 can be replaced with VSS. Consequently, the necessary potentials are three or four.

In general, in the case where the threshold of the second transistor Tr2 is V1 [V], five potentials, i.e., VDD, VSS, the +3 V potential needed for the terminal D, the (V1+3+α) [V] potential (α≥0) needed to turn on the second transistor Tr2, and the (V1−1.5−β) [V] potential (β≥0) needed to turn off the second transistor Tr2, are necessary.

Among the above potentials, the +3 V potential needed for the terminal D can be replaced with the (V1+3+α) [V] potential needed to turn on the second transistor Tr2 when V1≥0. In the case where such replacement is made, the potential of the third node N3 is +3 V or more. Further, when −3<V1<0, the potential needed to turn on the second transistor Tr2 can be replaced with the +3 V potential needed for the terminal D. In the case where such replacement is made, the potential of the third node N3 is +3 V. In any case, the number of necessary potentials can be reduced by one.

In the case where V1≥1.5 [V], the (V1−1.5−β) [V] potential needed to turn off the second transistor Tr2 can be replaced with VSS. In this case, the number of necessary potentials can be further reduced by one.

In a method of driving the above-described programming unit described above, when the threshold of the second transistor Tr2 is set as appropriate, a potential difference between the gate and the source (or drain) of the second transistor Tr2 can be more reduced.

Thus, the maximum potential of the gate of the second transistor Tr2 is (V1+3) [V] or more and the lower potential of the terminal D is 0 V, and therefore a difference between these potentials is |V1+3| [V] or more. When the second transistor Tr2 is turned off, the minimum potential of the gate of the second transistor Tr2 is (V1−1.5) [V] or less, and the higher potential of the terminal D is +3 V; therefore a difference between these potentials is |V1−4.5| [V] or more.

Thus, when V1 with which |V1+3| [V] equals |V1−| [V] is selected, the maximum potential difference between the gate and the source (or drain) of the second transistor Tr2 can be minimized. Specifically, when V1=+0.75 [V], the maximum potential difference between the gate and the source (or drain) of the second transistor Tr2 is 3.75 V, which is its minimum value.

(Embodiment 3)

An operation example in which the circuit in FIG. 2B is used as a programming unit is described below. In order that the first node N1 and the second node N2 in the programming unit illustrated in FIG. 2B can be always in a disconnection state, the potential of the third node N3 needs to be equal to or above the sum of the threshold of the first transistor Tr1 and VDD. Here, when the threshold of the first transistor Tr1 is set to −0.5 V, the potential of the third node N3 is required to be +1.5 V or more. Actually, the potential of the third node N3 is preferably +2 V or more so as to sufficiently increase the off-state resistance.

In the same way, in order that the first node N1 and the second node N2 in the programming unit can be always in a connection state, the potential of the third node N3 needs to be equal to or below the sum of the threshold of the first transistor Tr1 and VSS. Therefore, the potential of the third node N3 needs to be −0.5 V or less. Actually, the potential of the third node N3 is preferably −1 V or less so as to sufficiently reduce the on-state resistance.

Therefore, the potential of the terminal D is required to be −1 V or less or +2 V or more. Here, the potential of the terminal D is set to −1 V or +2 V. The first node N1 and the second node N2 in the programming unit are disconnected when the potential of the terminal D is +2 V, and the first node N1 and the second node N2 are connected when the potential of the terminal D is −1 V.

An operation of the second transistor Tr2 when the above conditions are employed for the terminal D is considered. When the potential of the terminal D is +2 V, the potential of the terminal G needs to be equal to or above the sum of +2 V and the threshold of the second transistor Tr2. Therefore, the potential of the terminal G needs to be (V1+2+α) [V] when the threshold is V1 [V]. Here, α is preferably 0 or more.

In the case where the potential of the terminal D is −1 V, the potential of the gate (i.e., terminal G) for obtaining the off-state current needed to hold the potential of the terminal D in the third node N3 is required to be equal to or below the value obtained by subtraction of 1.5−(−1)=2.5 [V] from the threshold. That is, the potential of the terminal G needs to be (V1−2.5−β) [V]. Here, β is preferably 0 or more.

Five potentials, i.e., VDD, VSS, the −1 V potential needed for the terminal D, the (V1+2+α) [V] potential (α≥0) needed to turn on the second transistor Tr2, and the (V1−2.5−β) [V] potential (β≥0) needed to turn off the second transistor Tr2, are necessary.

Here, when V1≥+1.5 [V], the (V1−2.5−β) [V] potential needed to turn off the second transistor Tr2 can be replaced with the −1 V potential needed for the terminal D. That is, when the potential of the terminal G is −1 V, sufficient off-state characteristics can be obtained. In this case, the number of necessary potentials can be reduced by one.

Further, when V1≤0 [V], the (V1+2+α) [V] potential needed to turn on the second transistor Tr2 can be replaced with VDD. In that case, the number of necessary potentials can be reduced by one.

Furthermore, when V1≤+1.5 [V], the −1 V potential needed for the terminal D can be replaced with the (V1−2.5−β) [V] potential needed to turn off the second transistor Tr2. In other words, (V1−2.5−β) [V] is input as the lower potential of the terminal D, the potential of the terminal G is set to VDD so that the second transistor Tr2 can be turned on, and then the potential of the terminal G is set to (V1−2.5−β) [V]. Note that the potential of the terminal D is set to VSS or more when data is held.

With the second transistor Tr2 in such conditions, sufficient off-state characteristics cannot be obtained and therefore the potential of the third node N3 at first increases from (V1−2.5−β) [V]; however, when the potential of the third node N3 increases to be higher than the gate potential of the second transistor Tr2 by (V1−1.5) [V] (i.e., when the potential of the third node N3 becomes (−1−β) [V]), sufficient off-state characteristics can be obtained and therefore the potential does not increase any more. That is, a potential of −1 V or less is input to the third node N3 as a result.

In the method of driving a programming unit described in this embodiment, the maximum potential of the terminal G can be more reduced than that in Embodiment 2. Although the maximum potential of the gate of the second transistor Tr2 is (V1+3) [V] or more in Embodiment 2, in Embodiment 3, the maximum potential of the gate of the second transistor Tr2 is (V1+2) [V] or more, i.e., lower by 1 V than that in Embodiment 2.

(Embodiment 4)

An operation example in which the circuit in FIG. 2C is used as a programming unit is described below. In order that the first node N1 and the second node N2 in the programming unit illustrated in FIG. 2C can be always in a connection (or disconnection) state, the potential of the third node N3 is preferably +3 V or more (or 0 V or less) as described in Embodiment 2.

However, the above is necessary at the stage when a circuit configured by connection or disconnection by the programming unit functions (during operation), but is not always necessary during a configuration of the programming unit. For example, the potential of the terminal D can be a potential of +2 V or less during a configuration.

For example, the potential of the terminal D is set to −1 V or +2 V during a configuration. In order that this potential can be input to the third node N3, the potential of the gate of the second transistor Tr2 (i.e., terminal G) is preferably (V1+2) [V] or more. Further, the potential of the terminal E at this time is set to −1 V.

During the period excluding the configuration period, the potential of the terminal E is increased to 0 V by 1 V. Then, the potential of the third node N3 connected to the terminal E through the capacitor Cs also increases to 0 V or +3 V by 1 V. That is, the first node N1 and the second node N2 are in either a connection state or a disconnection state.

When the potential of the third node N3 is 0 V or +3 V, the potential of the terminal G is preferably set to (V1−1.5) [V] or less in order that the second transistor Tr2 can certainly be turned off. Note that the potential of the terminal D is preferably 0 V or more.

In sum, five potentials, i.e., VDD, VSS, a potential of (V1+2+α) [V] (α≥0), a potential of (V1−1.5−β) [V] (β≥0), and a potential of −1 V, are necessary. Among these potentials, the (V1−1.5−β) [V] potential for turning off the second transistor Tr2 can be replaced with a potential of −1 V when V1≥+0.5 [V]. In the case where such replacement is made, the necessary potentials are four. When V1≤0 [V], the (V1+2+α) [V] potential for turning on the second transistor Tr2 can be replaced with VDD, and thus the number of necessary potentials can be further reduced by one.

In this embodiment, the necessary potential range (maximum potential−minimum potential) is 3.5 V (when V<+0.5 [V]) or (V1+3) [V] (when V1≥+0.5 [V]), which can be smaller by 1 V than that in Embodiment 2 or Embodiment 3.

This is because the potential of the terminal E is changed by 1 V so as to be different during a configuration period and during the other period (during operation). The maximum potential necessary for the circuit is preferably reduced in that such reduction can reduce a load on an element to which the potential is applied and on a potential generating circuit.

(Embodiment 5)

An operation example in which the circuit in FIG. 2C is used as a programming unit is described below. In this embodiment, the potential of the terminal E is changed in accordance with the potential of the terminal D during a configuration. For example, the potential of the terminal E is set to 0 V when the potential of the terminal D is +1.5 V, or the potential of the terminal E is set to +1.5 V when the potential of the terminal D is 0 V. In such a case, the potential of the terminal E is said to be a potential complementary to the potential of the terminal D.

In order that the potential of the terminal D can be input to the third node N3, the potential of the gate of the second transistor Tr2 (i.e., terminal G) is preferably (V1+1.5) [V] or more. Further, the potential of the third node N3 changes in accordance with the potential of the terminal E when the second transistor Tr2 is in an off-state. Actually, since the programming units are arranged in a matrix, even when the second transistor Tr2 is in an off-state, a potential (i.e., +1.5 V or 0 V) which is used to input data to the other programming units is applied to the terminal E, and the potential of the third node N3 changes accordingly and has a minimum value of −1.5 V. Therefore, in order that the second transistor can certainly be turned off, the potential of the terminal G is required to be set to (V1−3) [V] or less.

During the period excluding the configuration period, the potential of the terminal E is set to +1.5 V. Then, the potential of the third node N3 connected to the terminal E through the capacitor Cs becomes 0 V or +3 V. In other words, the first node N1 and the second node N2 are in either a connection state or a disconnection state.

In sum, five potentials, i.e., VDD, VSS, a potential of (V1+1.5+α) [V] (α≥0), a potential of (V1−3−β) [V] (β≥0), and a potential of +1.5 V, are necessary. Among these potentials, the greater than or equal to (V1+1.5) [V] potential for turning on the second transistor Tr2 can be replaced with VDD. In the case where such replacement is made, the necessary potentials are four.

The above +1.5 V potential can be replaced with VDD. Also in the case where such replacement is made, the necessary potentials may be four. In such a case, for example, during a configuration, the potential of the terminal E is set to VSS when the potential of the terminal D is VDD, or the potential of the terminal E is set to VDD when the potential of the terminal D is VSS.

In order that the potential of the terminal D can be input to the third node N3, the potential of the gate of the second transistor Tr2 (i.e., terminal G) is preferably (V1+VDD) or more (i.e., (V1+VDD+α) [V] (α≥0)). Further, when the second transistor Tr2 is in an off-state, the potential of the third node N3 changes in accordance with the potential of the terminal E. Other programming units are also connected to the terminal E and a potential for programming these units is supplied, and the potential of the terminal E changes in the range of VSS to VDD accordingly.

Therefore, the minimum value of the potential of the third node N3 is (2×VSS−VDD). In order that the second transistor can certainly be turned off, the potential of the terminal G is required to be set to (2×VSS−VDD+V1−1.5) [V] or less. In other words, four potentials, i.e., VDD, VSS, and a potential of (V1+VDD+α) [V], and a potential of (2×VSS−VDD+V1−1.5−β) [V] (β≥0), are necessary. Thus, the change in the potential of the terminal G is (2×VDD+α−2×VSS+1.5+β) [V].

After a configuration is finished, the potential of the terminal E is set to VDD. Then, the potential of the third node N3 connected to the terminal E through the capacitor Cs becomes (2×VDD−VSS) or VSS. When VDD=+2 V and VSS=0 V, the potential of the third node N3 is +4 V or 0 V, which is sufficient to connect or disconnect the first node N1 and the second node N2.

In the above example, although the potential of the third node N3 can be higher than VDD after a configuration is finished, the potential of the third node N3 may be lower than VDD during the configuration, which is effective in reducing power consumption.

For example, in the case where VDD=+2 V and VSS=0 V, energy needed to generate one pulse is 2C where C denotes the capacitance of a portion to which a pulse is conducted, and necessary energy becomes 4C because the change in the potential of the terminals D is 2 V during a configuration in a method of this embodiment. In contrast, in the case where the potential of the terminal D is set to +3 V and the potential of the terminal E is set to 0 V as in Embodiment 2 or Embodiment 3, energy needed to generate one pulse is 4.5 C, which is larger than the above. Thus, in the method described in this embodiment, power consumption can be reduced. Further, when a potential used for a configuration and a potential used for the circuit after the configuration is finished are the same, circuit design is also facilitated.

(Embodiment 6)

In Embodiment 5, the potential of the third node N3 can become lower than VSS by the influence of the change in the potential of the terminal E during a configuration; therefore, the minimum potential of the gate of the second transistor Tr2 is required to be reduced accordingly.

In Embodiment 6, the third transistor Tr3 is provided on the counter electrode side of the capacitor Cs so that the change in the potential of the terminal E does not affect the capacitor Cs. In this structure, the potential of the third node N3 is prevented from becoming lower than VSS and thus the minimum potential of the gate of the second transistor Tr2 is increased, which leads to a further reduction in power consumption.

As the third transistor Tr3, a transistor having an on/off ratio in six or more digits is preferably used. If possible, the third transistor Tr3 preferably has on-state characteristics and off-state characteristics equivalent to those of the second transistor Tr2. Although an n-channel transistor is used in FIG. 2D, a p-channel transistor may be used. It is acceptable that the switching speed of the third transistor Tr3 is substantially the same as or higher than that of the second transistor Tr2. Here, a transistor having characteristics similar to those of the second transistor Tr2 is used. Note that since the on/off ratio of the transistor Tr3 may be not so high, the third transistor Tr3 can have a shorter channel than the second transistor Tr2.

A driving method is briefly described below. Here, during writing of data to a programming unit, the potential of the terminal E is set to VSS when the potential of the terminal D is VDD, or the potential of the terminal E is set to VDD when the potential of the terminal D is VSS.

First, the second transistor Tr2 and the third transistor Tr3 are turned on. For example, the potentials of the terminal G1 and the terminal G2 are each set to (VDD+V1+$\alpha$) [V] ($\alpha \geq 0$).

After that, only the second transistor Tr2 is turned off and the potential of the terminal E is set to VDD. Consequently, the potential of the third node N3 is either VSS or (2×VDD−VSS). Since VDD is higher than VSS, the relationship of VSS<(2×VDD−VSS) is derived. Thus, in order that the second transistor Tr2 can be turned off, the potential of the terminal G1 is preferably set to (VSS+V1−1.5−$\beta$) [V] ($\beta \geq 0$).

After that, the third transistor Tr3 is turned off. For example, the potential of the terminal G2 is preferably set to (VSS+V1−1.5−$\beta$) [V].

As described above, the change in the potential of the terminal G1 is (VDD+$\alpha$−VSS+1.5+$\beta$) [V]. This change is smaller by (VDD−VSS) [V] than in the change in Embodiment 5, and thus power consumption can be reduced.

(Embodiment 7)

An operation example in which the circuit in FIG. 2C is used as a programming unit is described below. Also in this embodiment, the potential of the terminal E is changed in accordance with the potential of the terminal D during a configuration so that the potentials are complementary to each other. For example, the potential of the terminal E is set to VSS (=0 V) when the potential of the terminal D is VDD (=+2 V), or the potential of the terminal E is set to VDD when the potential of the terminal D is VSS. In this embodiment, V1 is set to +1 V or less.

The potential of the gate of the second transistor Tr2 (i.e., terminal G) is set to VDD. Then, the potential of the third node N3 becomes either (2−V1) [V] or 0 V when the second transistor Tr2 is in an on-state. Further, the minimum value of the potential of the third node N3 is −2 V when the second transistor Tr2 is in an off-state; therefore, in order that the second transistor Tr2 can certainly be turned off, the potential of the terminal G is required to be set to (V1−3.5) [V] or less.

During the period excluding the configuration period, the potential of the terminal E is set to +2 V. Then, the potential of the third node N3 connected to the terminal E through the capacitor Cs becomes 0 V or (4−V1) [V] ($\geq$+3 V). That is, the first node N1 and the second node N2 are in either a connection state or a disconnection state.

In sum, the circuit can be driven with three potentials, i.e., VDD, VSS, and a potential of (V1−3.5−$\beta$) [V] ($\beta \geq 0$).

(Embodiment 8)

An operation example in which the circuit in FIG. 2C is used as a programming unit is described below. In this embodiment, the potential of the terminal E is changed to either +3 V or 0 V during a configuration. Further, the potential of the terminal D is fixed at 0 V.

In order that the second transistor Tr2 can be turned on, the potential of the terminal G is preferably (V1+$\alpha$) [V]. Further, the minimum value of the potential of the third node N3 is −3 V when the second transistor Tr2 is in an off-state; therefore, in order that the second transistor Tr2 can certainly be turned off, the potential of the terminal G is required to be set to (V1−4.5−$\beta$) [V].

During the period excluding the configuration period, the potential of the terminal E is set to +3 V. Then, the potential of the third node N3 connected to the terminal E through the capacitor Cs becomes 0 V or +3 [V]. That is, the first node N1 and the second node N2 are in either a connection state or a disconnection state.

In sum, five potentials, i.e., VDD, VSS, a potential of (V1+$\alpha$) [V] ($\alpha \geq 0$), a potential of (V1−4.5−$\beta$) [V] ($\beta \geq 0$), and a potential of +3 V, are necessary. Note that when V1$\leq$+2 [V], the (V1+$\alpha$) [V] potential can be replaced with VDD.

(Embodiment 9)

Figure 3A:
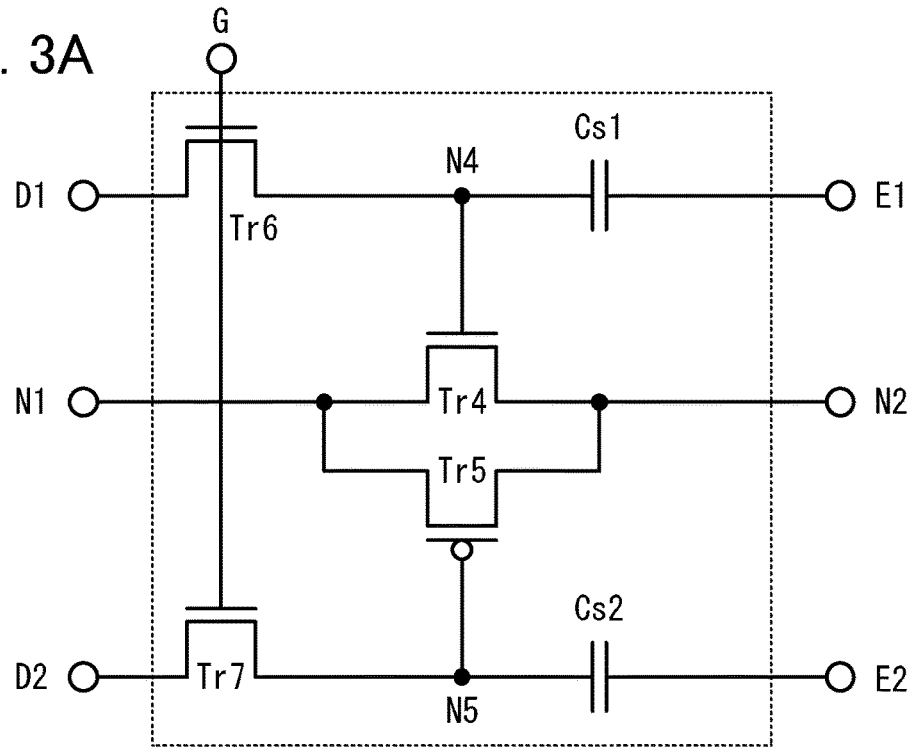
FIGS. 3A and 3B each illustrate a circuit diagram of a programming unit.

An operation example in which the circuit in FIG. 3A is used as a programming unit is described below. A programming unit illustrated in FIG. 3A has a transfer gate circuit including an n-channel fourth transistor Tr4 and a p-channel fifth transistor Tr5, and one of ends of the transfer gate circuit is connected to the first node N1 and the other of the ends is connected to the second node N2.

A gate of the fourth transistor Tr4 is connected to one of electrodes of a first capacitor Cs1, and a gate of the fifth transistor Tr5 is connected to one of electrodes of a second capacitor Cs2. The gate of the fourth transistor Tr4 is also connected to one of a source and a drain of a sixth transistor Tr6; this portion is defined as a fourth node N4. The gate of the fifth transistor Tr5 is also connected to one of a source and a drain of a seventh transistor Tr7; this portion is defined as a fifth node N5.

The other of the source and drain of the sixth transistor Tr6 is connected to a terminal D1, and the other of the source and drain of the seventh transistor Tr7 is connected to a terminal D2. A gate of the sixth transistor Tr6 and a gate of the seventh transistor Tr7 are both connected to a terminal G. The other of the electrodes of the first capacitor Cs1 is connected to a terminal E1, and the other of the electrodes of the second capacitor Cs2 is connected to a terminal E2.

In such a programming unit, in order that the first node N1 and the second node N2 can be always in a connection (disconnection) state, the potential of the fourth node N4 is required to be VDD or more (VSS or less) and the potential of the fifth node is required to be VSS or less (VDD or more).

Accordingly, changes in the potentials of the terminals D1 and D2 can be smaller than those in Embodiments 2 to 7. For example, to connect the first node N1 and the second node N2, it is preferable that the potential of the terminal D1 be set to VDD (=+2 V) and the potential of the terminal D2 be set to VSS (=0 V). In contrast, to disconnect the first node N1 and the second node N2, it is preferable that the potential of the terminal D1 be set to VSS (=0 V) and the potential of the terminal D2 be set to VDD (=+2 V).

In addition, in order that the potentials of the fourth node N4 and the fifth node N5 can have the above-described values, it is preferable that the potential of the gate of the sixth transistor Tr6 be set to be equal to or above the sum of the threshold and +2 V and the potential of the gate of the seventh transistor Tr7 be set to be equal to or above the sum of the threshold and +2 V. When the thresholds of the sixth transistor Tr6 and the seventh transistor Tr7 are both V1, the potential of the terminal G is preferably set to (V1+2) [V] or more.

In order that the sixth transistor Tr6 and the seventh transistor Tr7 can certainly be turned off, the potential of the terminal G is preferably set to (V1−1.5) [V] or less.

In sum, in this circuit, four potentials, i.e., VDD, VSS, a potential of (V1+2+α) [V] (α≥0), and a potential of (V1−1.5−β) [V] (β≥0), are necessary. Further, a difference between the maximum potential and the minimum potential can also be lower by 3.5 V than those in Embodiments 2 to 4. When V1 is 0 V or less, the (V1+2+α) [V] potential (α≥0) can be replaced with VDD, or when V1 is +1.5 V or more, the (V1−1.5−β) [V] potential can be replaced with VSS; thus, the number of necessary potentials can be further reduced by one.

(Embodiment 10)

An operation example in which the circuit in FIG. 3A is used as a programming unit is described below. Here is described the way how each of the potentials of the terminals E1 and E2 is made different during a configuration period and during the other period so as to reduce the difference between the maximum potential and the minimum potential.

As described in Embodiment 9, to connect the first node N1 and the second node N2, it is preferable that the potential of the terminal D1 be set to VDD (=+2 V) and the potential of the terminal D2 be set to VSS (=0 V). In contrast, to disconnect the first node N1 and the second node N2, it is preferable that the potential of the terminal D1 be set to VSS (=0 V) and the potential of the terminal D2 be set to VDD (=+2 V).

However, during a configuration, the above is unnecessary and a potential that less changes can also be used. For example, when the potential of the terminal D1 (terminal D2) during a configuration is +1 V (0 V), the potential of the terminal E1 (terminal E2) is set to 0 V (+1 V). When the potential of the terminal D1 (terminal D2) during a configuration is 0 V (+1 V), the potential of the terminal E1 (terminal E2) is set to +1 V (0 V).

Further, in order that the above potentials of the terminals D1 and D2 can be written to the fourth node N4 and the fifth node N5, it is preferable that the potential of the gate of the sixth transistor Tr6 be set to be equal to or above the sum of the threshold and +1 V, i.e., (V1+1) [V] or more, and the potential of the gate of the seventh transistor Tr7 be set to be equal to or above the sum of the threshold and +1 V, i.e., (V1+1) [V] or more.

The minimum value of the potential of the fourth node N4 is −1 V when the sixth transistor Tr6 is in an off-state, and the minimum value of the potential of the fifth node N5 is −1 V when the seventh transistor Tr7 is in an off-state. Therefore, in order that the sixth transistor Tr6 and the seventh transistor Tr7 can certainly be turned off, the potential of the terminal G is required to be set to (V1−2.5) [V] or less.

During the period excluding the configuration period, the potentials of the terminal E1 and the terminal E2 are both set to +1 V. Then, the potentials of the fourth node N4 and the fifth node N5 each become either +2 V or 0 V.

In sum, in this circuit, five potentials, i.e., VDD, VSS, a potential of (V1+1+α) [V] (β≥0), a potential of +1 V, and a potential of (V1−2.5−β) [V] (β≥0), are necessary. Here, when V1 is +1 V or less, the (V1+1+α) [V] potential can be replaced with VDD and thus the necessary potentials may be four.

(Embodiment 11)

An operation example in which the circuit in FIG. 3A is used as a programming unit is described below. Note that in this embodiment, V1 is set to +2 V or less.

As in Embodiment 10, each of the potentials of the terminals E1 and E2 is changed so as to be different during a configuration period and during the other period. For example, when the potential of the terminal D1 (terminal D2) during a configuration is +2 V (0 V), the potential of the terminal E1 (terminal E2) is set to 0 V (+2 V). When the potential of the terminal D1 (terminal D2) during a configuration is 0 V (+2 V), the potential of the terminal E1 (terminal E2) is set to +2 V (0 V). Note that the potential of the terminal G is set to VDD (=+2 V).

In this case, even when the potential of the terminal D1 is set to +2 V, the potential of the fourth node N4 becomes not +2 V but the value obtained by subtraction of the threshold of the sixth transistor Tr6 from +2 V, i.e., (2−V1) [V], and even when the potential of the terminal D2 is set to +2 V, the potential of the fifth node N5 becomes not +2 V but the value obtained by subtraction of the threshold of the seventh transistor Tr7 from +2 V, i.e., (2−V1) [V]. That is, the potentials of the fourth node N4 and the fifth node N5 each become (2−V1) [V] or 0 V.

The minimum value of the potential of the fourth node N4 is −2 V when the sixth transistor Tr6 is in an off-state, and the minimum value of the potential of the fifth node N5 is −2 V when the seventh transistor Tr7 is in an off-state. Therefore, in order that the sixth transistor Tr6 and the seventh transistor Tr7 can certainly be turned off, the potential of the terminal G is required to be set to (V1−3.5) [V] or less.

During the period excluding the configuration period, the potentials of the terminal E1 and the terminal E2 are both set to +2 V. Then, the potentials of the fourth node N4 and the fifth node N5 each become either (4−V1) [V] (≥+2 [V]) or 0 V.

In sum, in this circuit, three potentials, i.e., VDD, VSS, and a potential of (V1−3.5−β) [V] (β≥0), are necessary.

(Embodiment 12)

Figure 3B:
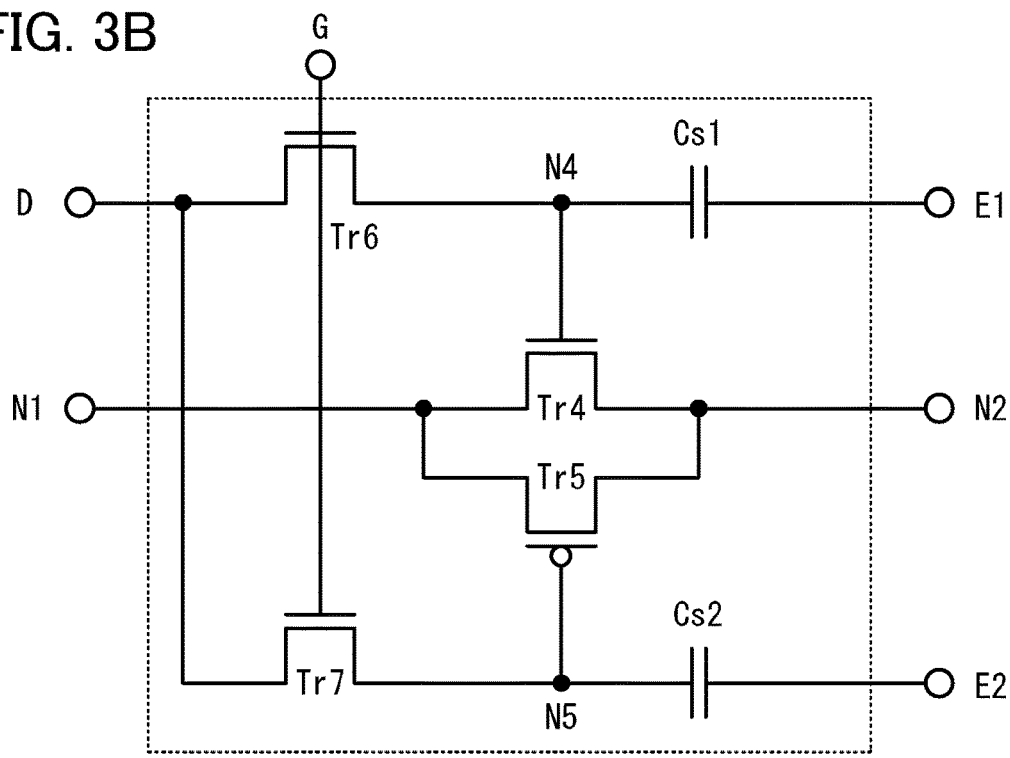

An operation example in which the circuit in FIG. 3B is used as a programming unit is described below. A circuit structure of the programming unit illustrated in FIG. 3B is almost the same as that illustrated in FIG. 3A, but is simplified in such a way that the other of the source and drain of the sixth transistor Tr6 and the other of the source and drain of the seventh transistor Tr7 are both connected to the terminal D.

As in the programming unit in FIG. 3A, in order that the first node N1 and the second node N2 can be always in a connection (or disconnection) state, it is preferable that the potential of the fourth node N4 be set to VDD or more (or VSS or less) and the potential of the fifth node N5 be set to VSS or less (or VDD or more).

Here is described the way how each of the potentials of the terminals E1 and E2 is made different during a configuration period and during the other period so as to reduce the difference between the maximum potential and the minimum potential. For example, the potential of the terminal E2 is set to +2 V when the potential of the terminal E1 is 0 V during a configuration, or the potential of the terminal E2 is 0 V when the potential of the terminal E1 during a configuration is +2 V. Note that the potential of the terminal D is here fixed at 0 V.

In order that the sixth transistor Tr6 and the seventh transistor Tr7 can be turned on, the potential of the terminal G is preferably (V1+α) [V] (α≥0). The minimum value of the potential of the fourth node N4 is −2 V when the sixth transistor Tr6 is in an off-state, and the minimum value of the potential of the fifth node N5 is −2 V when the seventh transistor Tr7 is in an off-state. Therefore, in order that the sixth transistor Tr6 and the seventh transistor Tr7 can certainly be turned off, the potential of the terminal G is required to be set to (V1−3.5) [V] or less.

During the period excluding the configuration period, the potential of the terminal E1 is set to +2 V and the potential of the terminal E2 is set to 0 V. Then, the potentials of the fourth node N4 and the fifth node N5 each become either 0 V or +2 [V]. That is, the first node N1 and the second node N2 are in either a connection state or a disconnection state.

In the above-described operation, the circuit can be driven with four potentials, i.e., VDD, VSS, a potential of (V1+α) [V] (α≥0), and a potential of (V1−3.5−β) [V] (β≥0). Note that when V1≤+2 [V], the (V1+α) [V] potential can be replaced with VDD.

(Embodiment 13)

Figure 5A:
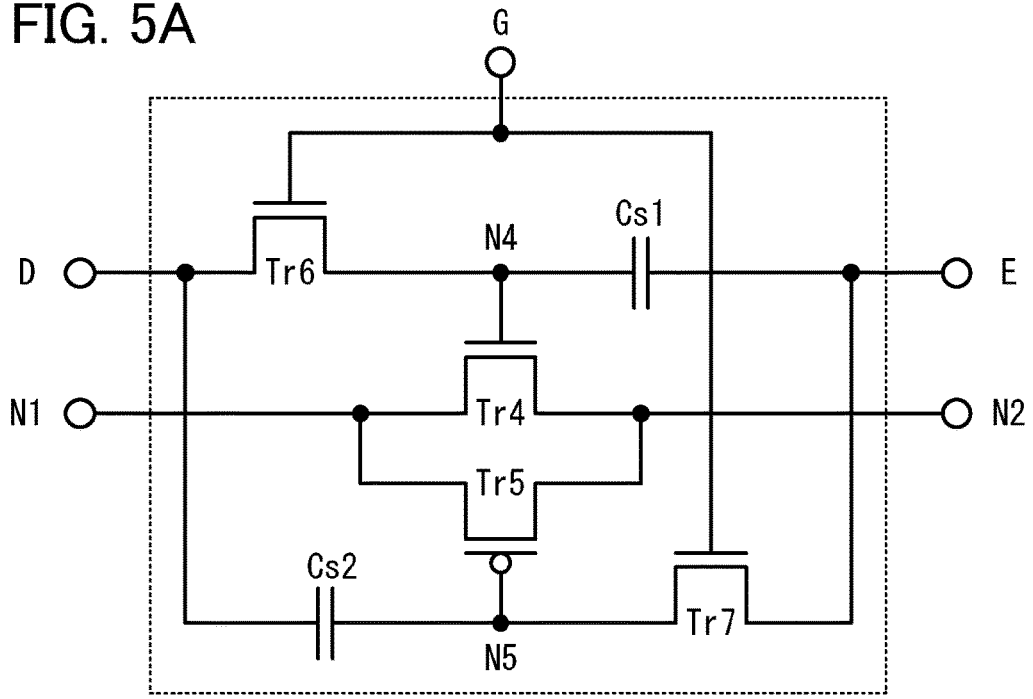
FIGS. 5A and 5B each illustrate a circuit diagram of a programming unit.

An operation example in which the circuit in FIG. 5A is used as a programming unit is described. The programming unit illustrated in FIG. 5A has the same structure which is the same as that of the programming unit in FIG. 3A and in which the terminal E2 is connected to the terminal D1 and the terminal D2 is connected to the terminal E1.

During a configuration, complementary potentials are applied to the terminals D and E. For example, the potential of the terminal E is set to VSS when the potential of the terminal D is VDD, or the potential of the terminal E is set to VDD when the potential of the terminal D is VSS.

In order that the first node N1 and the second node N2 in the programming unit in FIG. 5A can be always in a connection (or disconnection) state, it is preferable that the potential of the fourth node N4 be set to VDD or more (or VSS or less) and the potential of the fifth node N5 be set to VSS or less (or VDD or more).

In order that the sixth transistor Tr6 and the seventh transistor Tr7 can be turned on, the potential of the terminal G is preferably (VDD+V1+α) [V] (α≥0). The minimum value of the potential of the fourth node N4 is (VSS−VDD) when the sixth transistor Tr6 is in an off-state, and the minimum value of the potential of the fifth node N5 is (2×VSS−VDD) when the seventh transistor Tr7 is in an off-state. Therefore, in order that the sixth transistor Tr6 and the seventh transistor Tr7 can certainly be turned off, the potential of the terminal G is required to be set to (V1−1.5+2×VSS−VDD) [V] or less.

During the period excluding the configuration period, the potentials of the terminals D and E are both set to VDD. Then, the potentials of the fourth node N4 and the fifth node N5 each become either VSS or (2×VDD−VSS). That is, the first node N1 and the second node N2 are in either a connection state or a disconnection state.

In the above-described operation, the circuit can be driven with four potentials, i.e., VDD, VSS, a potential of (VDD+V1+α) [V] (α≥0), and a potential of (V1−1.5+2×VSS−VDD−β) [V] (β≥0). Note that when V1≤0 [V], the (VDD+V1+α) [V] potential can be replaced with VDD.

(Embodiment 14)

Figure 5B:
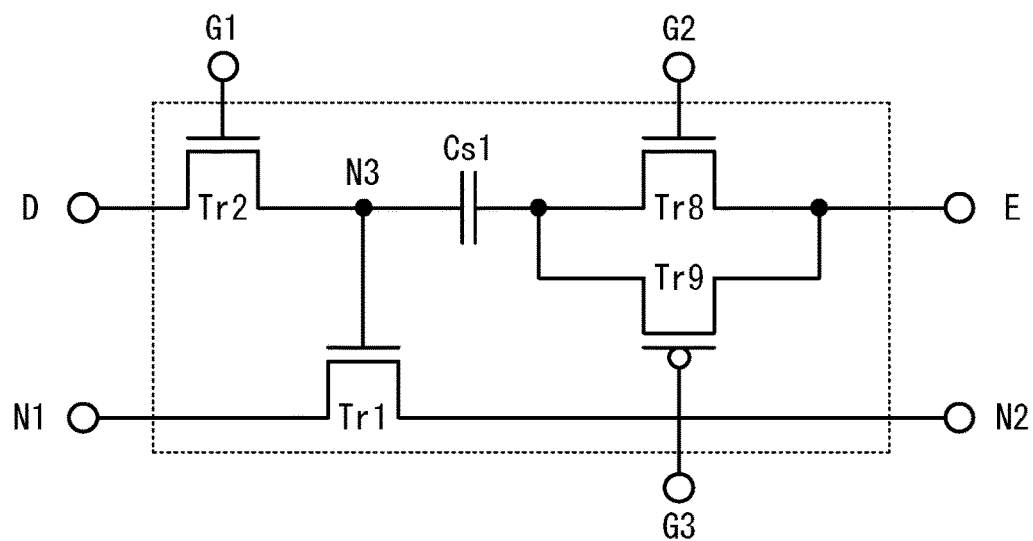

An operation example in which the circuit in FIG. 5B is used as a programming unit is described. The programming unit illustrated in FIG. 5B has a structure which is the same as the programming unit in FIG. 2D and in which a function of the third transistor Tr3 is performed by a transfer gate including an eighth transistor Tr8 and a ninth transistor Tr9.

Specifically, the second transistor Tr2 and the transfer gate including the eighth transistor Tr8 and the ninth transistor Tr9 are turned on and off as in the programming unit in FIG. 2D.

Therefore, VDD or VSS can be used as each of the potentials of the terminal G2 and a terminal G3, and accordingly power consumption can be further reduced. Operation other than that of the transfer gate can be performed as in the programming unit illustrated in FIG. 2D.

During a configuration, complementary potentials are applied to the terminals D and E. For example, the potential of the terminal E is set to VSS when the potential of the terminal D is VDD, or the potential of the terminal E is set to VDD when the potential of the terminal D is VSS. In order that the first node N1 and the second node N2 in the programming unit in FIG. 5B can be always in a connection (or disconnection) state, the potential of the third node N3 is preferably set to VDD or more (or VSS or less).

In order that the second transistor Tr2 can be turned on, the potential of the terminal G1 is preferably (VDD+V1+α) [V] (α≥0). The minimum value of the potential of the third node N3 can be VSS when the second transistor Tr2 is in an off-state; therefore, in order that the third transistor Tr3 can certainly be turned off, the potential of the terminal G1 is preferably (V1−1.5+VSS) [V] or less.

After the second transistor is turned off, the potential of the terminal E is set to VDD. Then, the potential of the third node N3 becomes either VSS or (2×VDD−VSS). That is, the first node N1 and the second node N2 are in either a connection state or a disconnection state. After that, the eighth transistor Tr8 and the ninth transistor Tr9 can be turned off.

In the above-described operation, the circuit can be driven with four potentials, i.e., VDD, VSS, a potential of (VDD+V1+α) [V] (α≥0), and a potential of (VSS+V1−1.5−β) [V] (β≥0). Note that when V1≤0 [V], the (VDD+V1+α) [V] potential can be replaced with VDD.

(Embodiment 15)

Figure 6A:
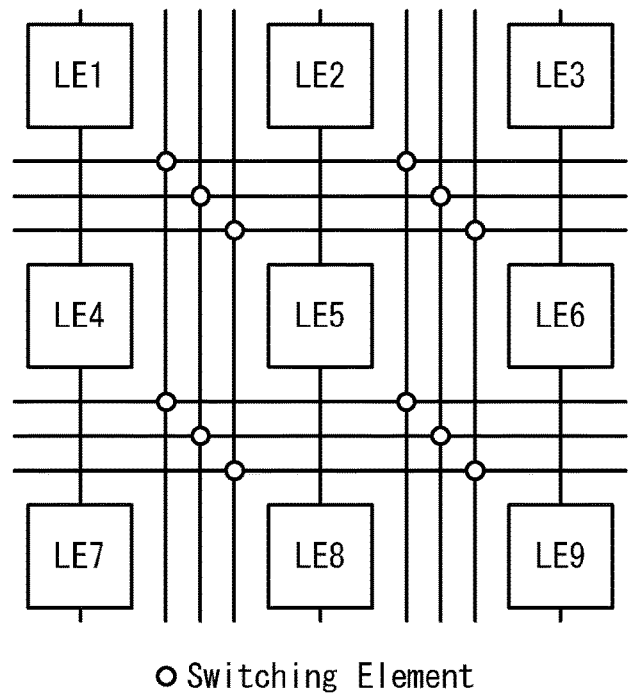
FIGS. 6A and 6B illustrate a structure of a semiconductor device.

In this embodiment, an example in which one embodiment of the present invention is applied to an FPGA is described. In the FPGA, a plurality of logic cells (LC1 to LC9) is arranged in a matrix as illustrated in FIG. 6A. The logic cells are connected to each other by wirings arranged in a matrix and switches provided to connect the wirings to each other.

Figure 6B:
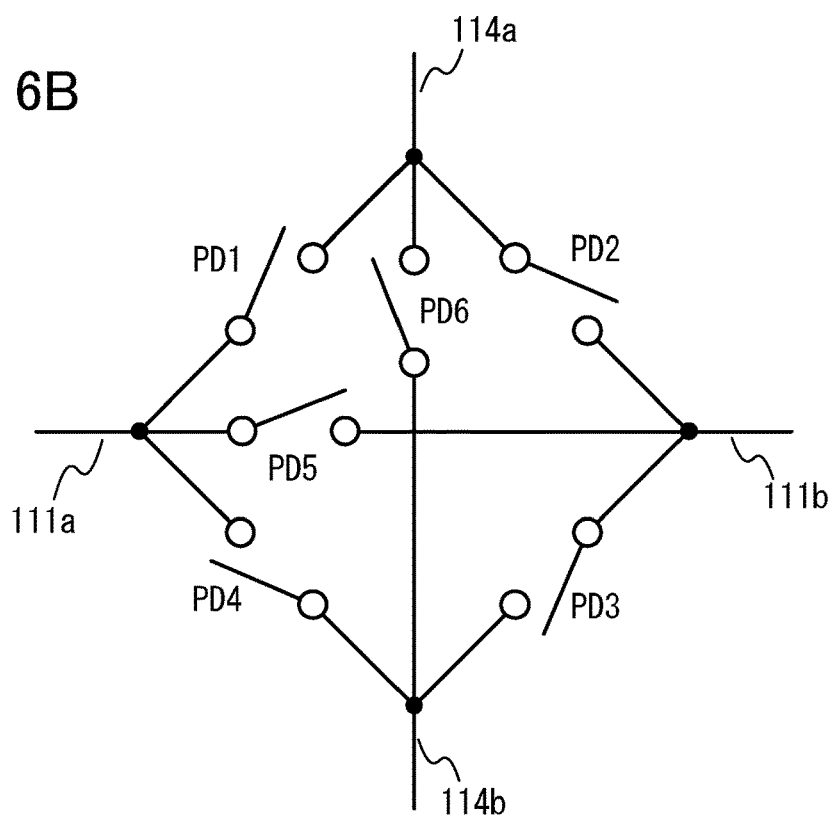

As illustrated in FIG. 6B, each switch includes six programming units (PD1 to PD6) which are formed so as to connect horizontal and vertical wirings. Such a programming unit has been formed with a programming unit having an SRAM or an EEPROM, but disadvantages in such a structure are as described above.

In this embodiment, these programming units are each formed with a programming unit including two switching elements and one capacitor, leading to higher integration scale and characteristics improvement. A structure of a switch is described below with reference to FIGS. 7A to 7C, FIGS. 8A to 8C, FIGS. 9A to 9D, and FIGS. 10A to 10E.

In FIGS. 7A to 7C and FIGS. 8A to 8C, layouts of wirings, contact plugs, and the like which mainly constitute a switch are illustrated. The dotted line A-B represents the same position in each drawing, and the dotted line C-D represents the same position in each drawing. For FIGS. 7A to 7C and FIGS. 8A to 8C, a known semiconductor fabrication technique or Patent Documents 1 and 4 to 6 can be referred to.

Figure 7A:
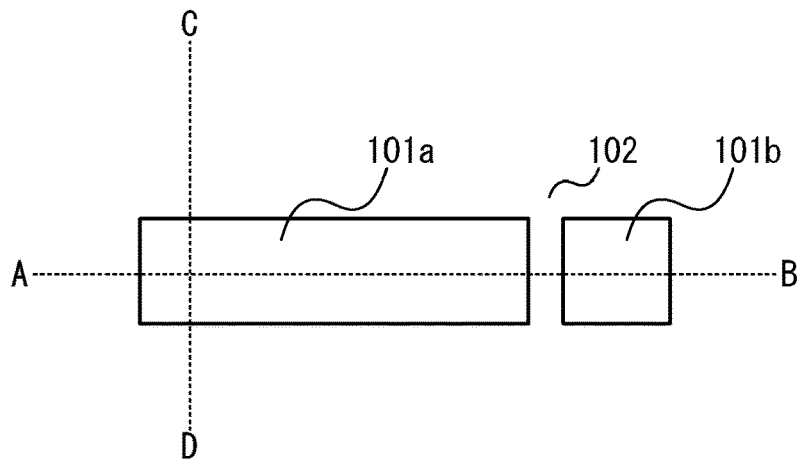
FIGS. 7A to 7C each illustrate a layout of a programming unit.

FIG. 7A illustrates positions of an element separation insulator 102 and element formation regions 101a and 101b, with which a surface of a substrate is provided. To fabricate the six switching elements which connect wirings extending in two intersecting directions (wirings 114a and 114b in the vertical direction and wirings 111a and 111b in the horizontal directions in FIG. 6B) as illustrated in FIG. 6B, two element formation regions (the element formation regions 101a and 101b in FIG. 7A) independent of each other are necessary even when an area for fabrication is reduced as much as possible.

Figure 7B:
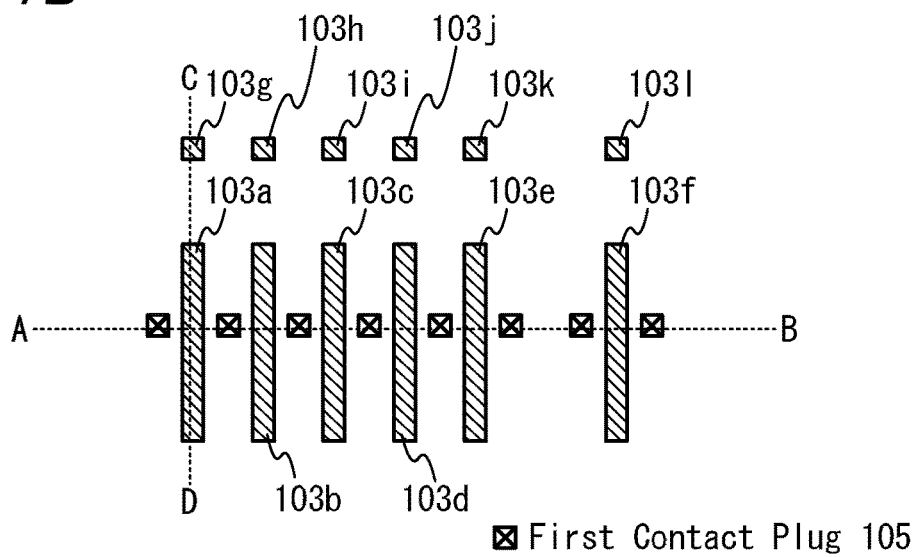

FIG. 7B illustrates positions of first layer wirings 103a to 103l and first contact plugs 105, which are formed over the element separation insulator 102 and the element formation regions 101a and 101b.

Here, the first layer wirings 103a to 103e are formed so as to cross the element formation region 101a, and the first layer wiring 103f is formed so as to cross the element formation region 101b. Thus, the first layer wirings 103a to 103f serve as the gates of the first switching elements included in the respective programming units.

The element formation regions 101a and 101b preferably have impurity regions (diffusion regions) with a shape in accordance with the first layer wirings 103a to 103f.

As apparent from the above, the length of each of the element formation regions 101a and 101b in the C-D direction is the channel width of a transistor of the first switching element. Therefore, in order that on-state resistance of the first switching element can be reduced, it is preferable that the lengths of the element formation regions 101a and 101b in the C-D direction be increased as much as possible (and the lengths of the first layer wirings 103a to 103f be also increased at the same time).

Specifically, the channel width of the transistor of the first switching element is preferably 2 to 10 times as long as the channel length. Note that the channel length is also preferably at least twice as long as the minimum line width. Unlike a conventional programming unit, the programming unit of this embodiment does not include a large-area component such as an SRAM and a larger area can be used for the transistor of the first switching element accordingly. Hence, characteristics with a large amount of on-state current and a small amount of off-state current can be achieved without short-channel effects.

The first layer wirings 103g to 103l each function as a pad when the contact plugs are formed over the first layer wirings 103g to 103l.

Figure 7C:
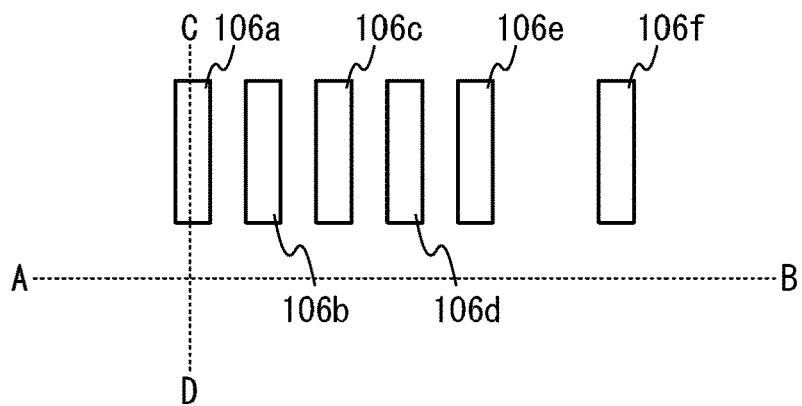

FIG. 7C illustrates positions of semiconductor layers 106a to 106f, which are formed over the first layer wirings 103a to 103l and the first contact plugs 105. For the semiconductor layers 106a to 106f, silicon, an oxide semiconductor, or the like in a polycrystal state, an amorphous state, or a polycrystal-amorphous mixture state can be used.

Figure 8A:
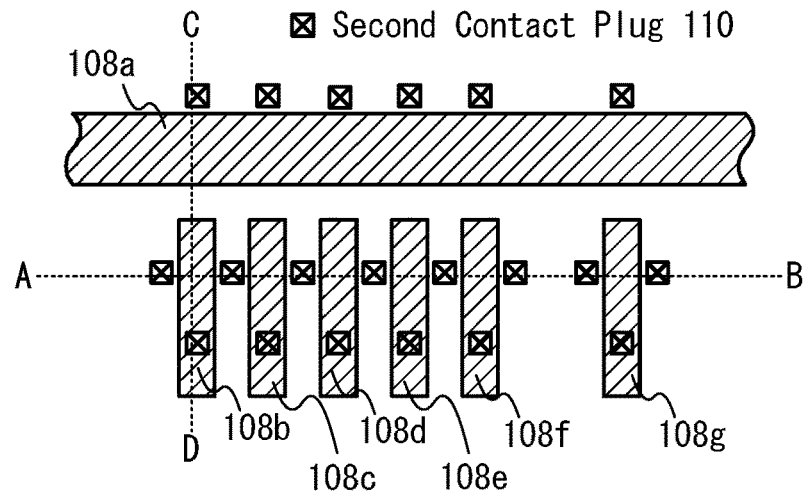
FIGS. 8A to 8C each illustrate a layout of a programming unit.

FIG. 8A illustrates positions of second layer wirings 108a to 108g and second contact plugs 110, which are formed over the semiconductor layers 106a to 106f. Here, the second layer wiring 108a extends in the horizontal direction as illustrated in the drawing. The second layer wiring 108a serves as the gate of the second switching element included in each programming unit.

The second layer wirings 108b to 108g are formed so as to substantially overlap with the first layer wirings 103a to 103f respectively, thereby forming capacitors. Therefore, when the first layer wirings 103a to 103f are lengthened in the C-D direction, the capacitance of the capacitors also increase, leading to improvement of the charge retention characteristics (i.e., configuration data retention characteristics) of the programming units.

Note that the second layer wirings 108b to 108g are each connected to wirings parallel to data wirings (wirings through which configuration data is transmitted) to be formed later through the second contact plugs 110 or the like formed over the second layer wirings 108b to 108g.

Figure 8B:
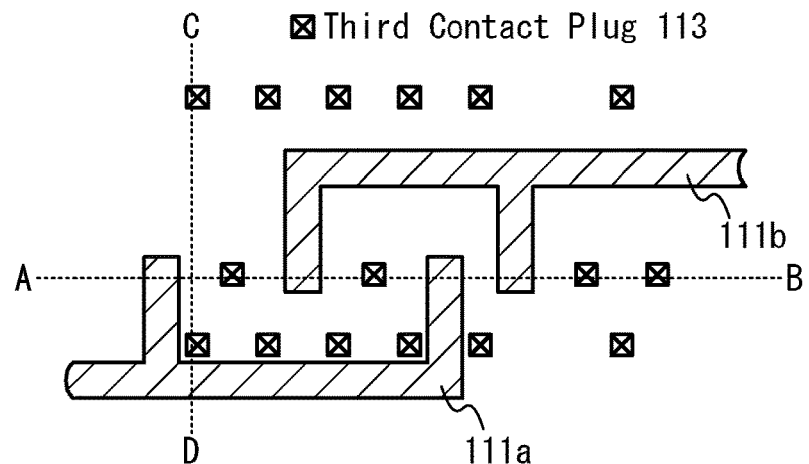

FIG. 8B illustrates positions of the third layer wirings 111a and 111b and third contact plugs 113, which are formed over the second layer wirings 108a to 108g and the second contact plugs 110. Here, the third layer wiring 111a is connected to the impurity region on the left side of the first layer wiring 103a and to the impurity region between the first layer wirings 103d and 103e. The third layer wiring 111b is connected to the impurity region between the first layer wirings 103b and 103c and to the impurity region on the right side of the first layer wiring 103e.

Figure 8C:
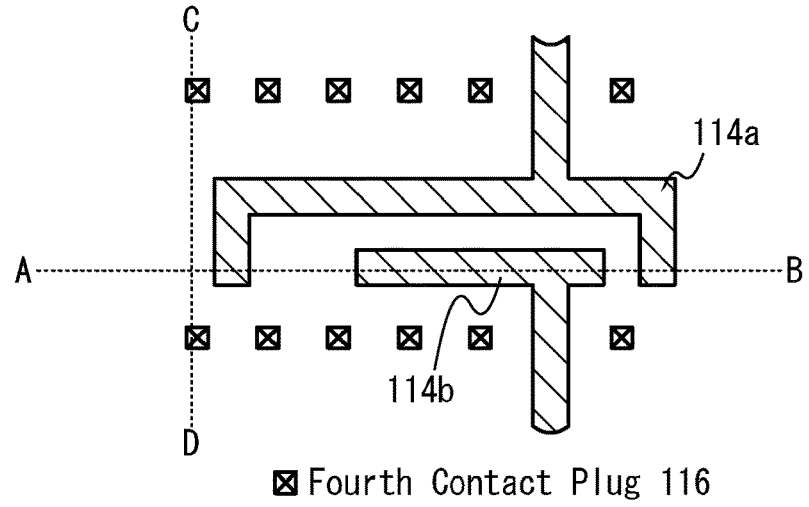

FIG. 8C illustrates positions of the fourth layer wirings 114a and 114b and fourth contact plugs 116, which are formed over the third layer wirings 111a and 111b and the third contact plug 113. Here, the fourth layer wiring 114a is connected to an impurity region between the first layer wirings 103a and 103b and to an impurity region on the right side of the first layer wiring 103f. The fourth layer wiring 114b is connected to an impurity region between the first layer wirings 103c and 103d and to an impurity region on the left side of the first layer wiring 103f.

As apparent from the above, the first layer wiring 103a is used to control the first switching element in the programming unit PD1 in FIG. 6B. In other words, the first switching element in the programming unit PD1 can be turned on or off by the potential of the first layer wiring 103a. In the same way, the first layer wiring 103b is used to control the first switching element in the programming unit PD2; the first layer wiring 103c is used to control the first switching element in the programming unit PD3; the first layer wiring 103d is used to control the first switching element in the programming unit PD4; the first layer wiring 103e is used to control the first switching element in the programming unit PD5; and the first layer wiring 103f is used to control the first switching element in the programming unit PD6.

FIGS. 9A to 9D illustrate cross sections along the dotted line A-B in FIGS. 7A to 7C and FIGS. 8A to 8C in the order of the manufacturing process. FIGS. 10A to 10E illustrate cross sections along the dotted line C-D in FIGS. 7A to 7C and FIGS. 8A to 8C in the order of the manufacturing process.

Figure 9A:
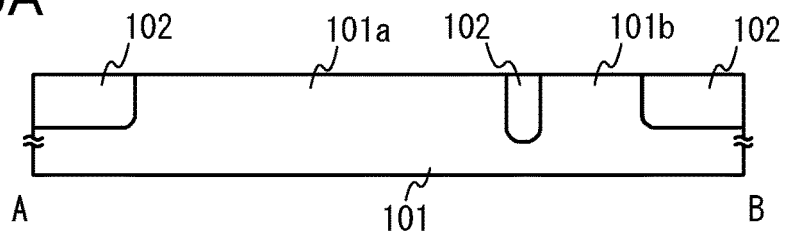
FIGS. 9A to 9D illustrate cross sections of a manufacturing process of a programming unit.
Figure 9B:
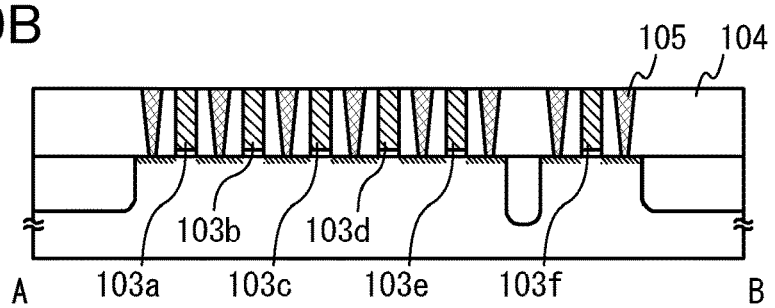

FIG. 9A illustrates a state in which the element separation insulator 102 is formed in a substrate 101. FIG. 9B illustrates a state in which layer wirings 103a to 103f, the first interlayer insulator 104, and the first contact plug 105 are further formed.

Figure 9C:
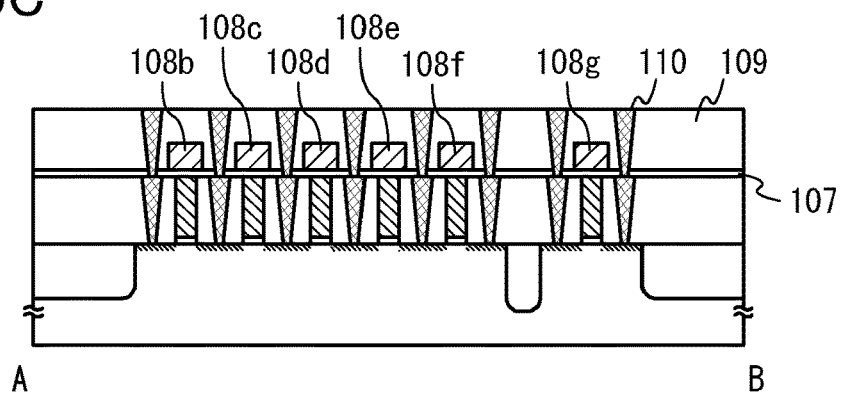
Figure 9D:
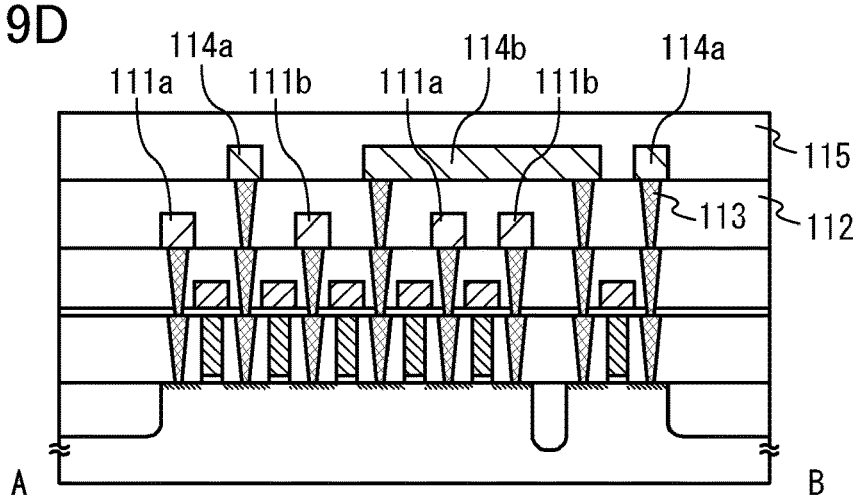

FIG. 9C illustrates a state in which the gate insulator 107, the second layer wirings 108b to 108g, the second interlayer insulator 109, and the second contact plug 110 are further formed. FIG. 9D illustrates a state in which the third layer wirings 111a and 111b, the third interlayer insulator 112, the third contact plug 113, the fourth layer wirings 114a and 114b, and the fourth interlayer insulator 115 are further formed.

Figure 10A:
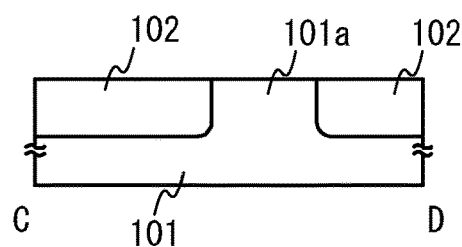
FIGS. 10A to 10E illustrate cross sections of a manufacturing process of a programming unit.
Figure 10B:
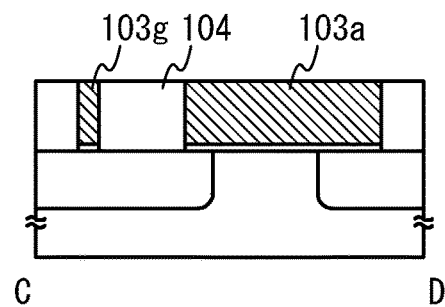
Figure 10C:
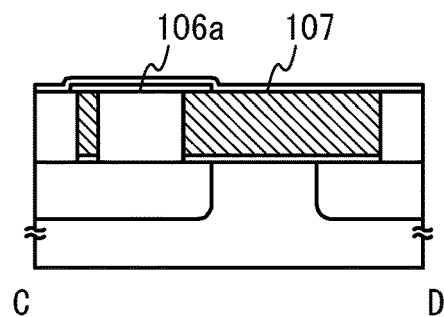

FIG. 10A illustrates a state in which the element separation insulator 102 is formed in the substrate 101. FIG. 10B illustrates a state in which the first layer wirings 103a and 103g and the first interlayer insulator 104 are further formed. FIG. 10C illustrates a state in which the semiconductor layer 106a and the gate insulator 107 are further formed.

Figure 10D:
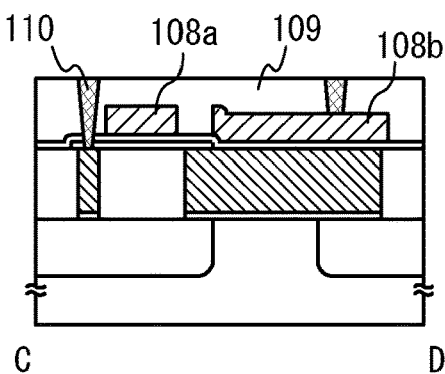

FIG. 10D illustrates a state in which the second layer wirings 108a and 108b, the second interlayer insulator 109, and the second contact plug 110 are further formed. The second layer wiring 108a serves as the gate of the second switching element in each the programming unit. The first layer wiring 103a, the second layer wiring 108b, and the gate insulator 107 as a dielectric constitute a capacitor.

Note that since the channel length of the second switching element corresponds to the distance between the first layer wirings 103a and 103g, an effective way of increasing the off-state resistance of the second switching element is to increase the distance between the first layer wirings 103a and 103g as much as possible. Such a way is also preferable in order to avoid a reduction in off-state resistance which is caused by a short-channel effect.

Figure 10E:
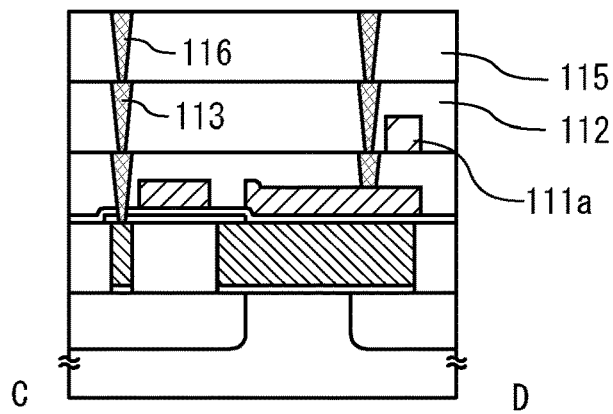

FIG. 10E illustrates a state in which the third layer wiring 111a, the third interlayer insulator 112, the third contact plug 113, the fourth interlayer insulator 115, and the fourth contact plug 116 are further formed. A data wiring intersecting with the second layer wiring 108a is preferably formed over the fourth contact plug 116. The programming unit manufactured in this embodiment has a circuit structure equivalent to that illustrated in FIG. 2C.

Note that the second switching element or the capacitor can be formed in a layer different from the above layer so that the area of the switch can be reduced and the area of the logic cell can be increased. For example, the area of the switch can be limited to only the vicinity of the element formation regions 101a and 101b in FIG. 7A. An example of such a structure is described with reference to FIGS. 11A to 11C.

Figure 11A:
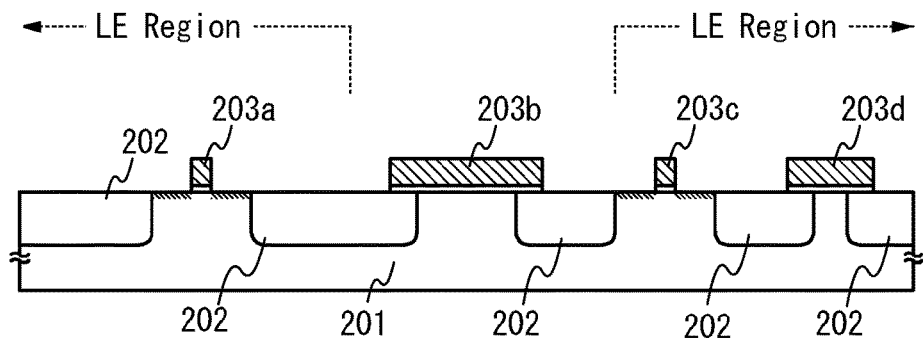
FIGS. 11A to 11C illustrate cross sections of a manufacturing process of a programming unit.
Figure 11B:
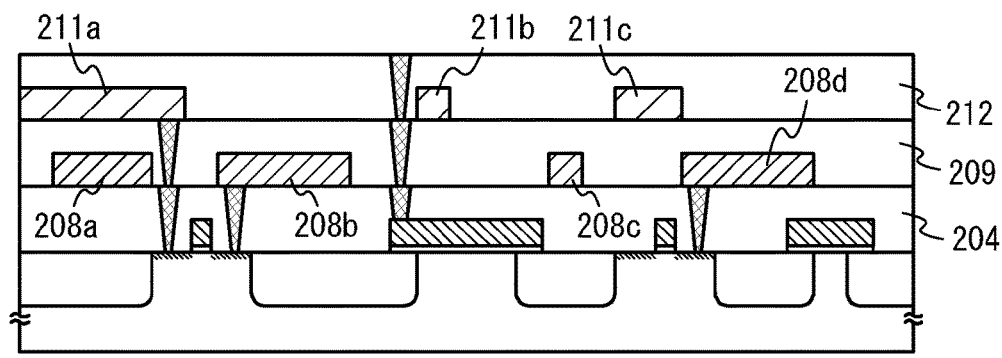
Figure 11C:
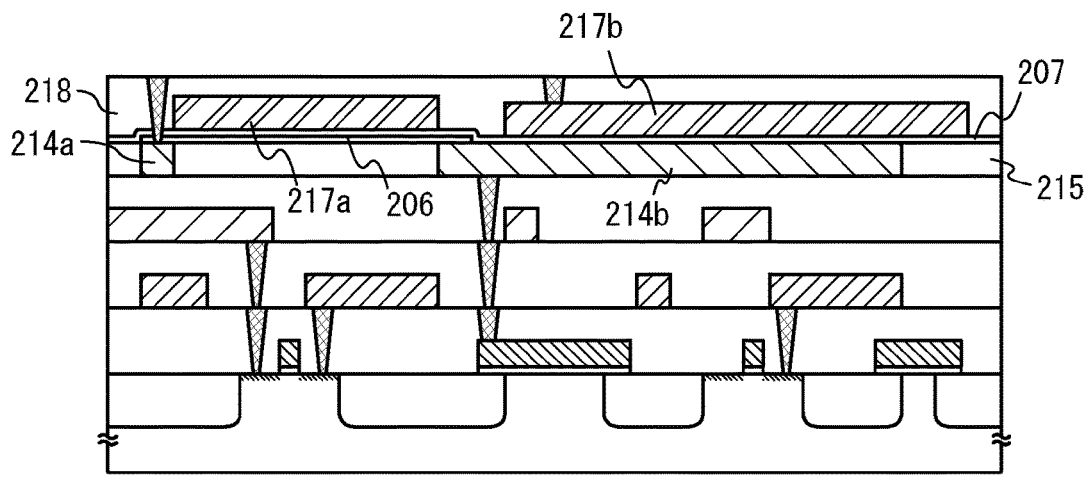

FIGS. 11A to 11C illustrates a cross-sectional structure similar to that in FIGS. 10A to 10E and largely occupied by a logic cell region (LC region). Note that in FIGS. 11A to 11C and explanation thereof, the contact plugs are not denoted by reference numerals.

FIG. 11A illustrates a state in which a substrate 201 is provided with an element separation insulator 202 and first layer wirings 203a to 203d. Here, the first layer wirings 203a, 203c, and 203d are wirings of a transistor in the logic cell region. The first layer wiring 203b serves as the gate of the first switching element in the programming unit.

FIG. 11B illustrates a state in which, over the element separation insulator 202 and the first layer wirings 203a to 203d, a first interlayer insulator 204 and a first contact plug are formed, and thereover, second layer wirings 208a to 208d, a second interlayer insulator 209, and a second contact plug are further formed, and thereover third layer wirings 211a to 211c, a third interlayer insulator 212, and a third contact plug are further formed.

Here, among the second layer wirings 208a to 208d and the third layer wirings 211a to 211c, only the second layer wiring 208b and the third layer wiring 211b relate to the programming unit and the other wirings relate to the logic cell. Although the wirings relating to the logic cell consist of the first to third layer wirings in FIGS. 11A to 11C, in addition to the first to third layer wirings, a wiring layer over these layer wirings may be used for the logic cell as needed.

FIG. 11C illustrates a state in which a fourth layer wiring 214a and a fourth layer wiring 214b are formed so as to be buried in a fourth interlayer insulator 215 over the third layer wirings 211a to 211c, the third interlayer insulator 212, and the third contact plug, and over the fourth layer wirings 214a and 214b, a semiconductor layer 206, a gate insulator 207, fifth layer wirings 217a and 217b, a fifth interlayer insulator 218, and a fourth contact plug are formed.

In FIG. 11C, the fourth layer wiring 214a corresponds to the first layer wiring 103g in FIGS. 10A to 10E and has a function as a pad. The fifth layer wiring 217a has a function as the gate of the second switching element. The channel length of the second switching element corresponds to the distance between the fourth layer wirings 214a and 214b. The fourth layer wiring 214b and the fifth layer wiring 217b constitute a capacitor in which the gate insulator 207 is a dielectric. The programming unit having such a structure has a circuit structure equivalent to that illustrated in FIG. 2C.

The fourth layer wirings 214a and 214b, the semiconductor layer 206, the gate insulator 207, the fifth layer wirings 217a and 217b, and the like are formed so as to overlap in the logic cell region as illustrated in FIG. 11C, so that the channel length of the second switching element can be sufficiently long and the area of the capacitor can be sufficiently large. Accordingly, the programming unit can have excellent configuration data retention characteristics.

In the case where the second switching element is provided in the upper layer portion of the multilayer wirings as in FIGS. 11A to 11C, multistep-contact plugs for connecting the first switching element to the second switching element are necessary. In addition, these contact plugs are influenced by the lower layer wiring.

If the capacitance of the capacitor is not sufficiently large, the potential of a reading gate might change due to the influence of a lower layer wiring to cause an unintentional operation. To avoid such a situation, the capacitance of the capacitor is required to be sufficiently large. In FIGS. 11A to 11C, there is a sufficient area over the logic cell region and therefore the capacitor with as large capacitance as necessary can be provided.

(Embodiment 16)

In this embodiment is described an FPGA in which a programming unit including a normal DRAM memory cell or a modified DRAM memory cell is used. For example, when the circuit structure illustrated in FIG. 2C is used for the programming unit, a structure of a DRAM memory cell is used for the second transistor Tr2 and the capacitor Cs.

In a DRAM, spontaneous charge release from the capacitor generally needs periodic writing of data (refresh). In general, several tens of refreshes are needed per second. Therefore, also in the case where a transistor and a capacitor of a normal DRAM are used for the programming unit, configuration data needs to be written several tens of times per second.

For example, the frequency of refreshes can be reduced to one-tenth when the channel length of the second transistor Tr2 in FIG. 2C is ten times as long as that in a normal DRAM or the capacitance of the capacitor Cs is ten times as large as that in a normal DRAM. When both the channel length and the capacitance increase ten times as long as those in the normal DRAM, the frequency of refreshes can be reduced to one-hundredth.

The above also means that time necessary for writing also increases to ten times (or one hundred times) as long as that for the normal DRAM and an area for the increases in channel length and capacitance is needed. However, these are acceptable because of some factors described later.

Although the need for periodic writing of configuration data might lead to an increase in power consumption, an SRAM consumes more power in driving than a DRAM when used to form programming units having the same structures especially with a circuit line width of 40 nm or less.

In particular, every time configuration data is periodically written as described above, a circuit configuration can be periodically changed by changing the configuration data, i.e., a dynamic reconfiguration can be performed. In this case, it is possible to from a circuit substantially equivalent to a circuit that is constituted of more logic cells than it actually is.

In the case where a dynamic reconfiguration is not performed, more logic cells are needed to be sufficient for the same level of performance as in the case where a dynamic reconfiguration is performed and a programming unit is further needed accordingly; thus, power consumption is further increased. For such a reason, a method in which configuration data is periodically written as in this embodiment is sufficiently superior to a conventional method.

FIGS. 12A to 12D are cross-sectional views illustrating a manufacturing process of the programming unit of this embodiment. FIGS. 12A to 12D correspond to FIGS. 10A to 10E or FIGS. 11A to 11C.

Figure 12A:
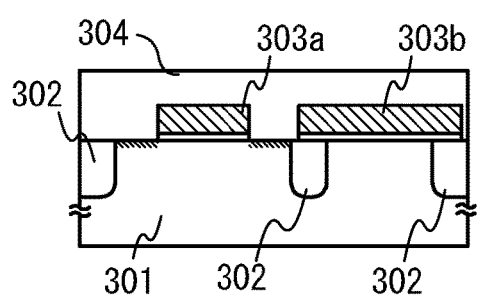
FIGS. 12A to 12D illustrate cross sections of a manufacturing process of a programming unit.

FIG. 12A illustrates a state in which a substrate 301 is provided with an element separation insulator 302, first layer wirings 303a and 303b, and a first interlayer insulator 304. Here, the first layer wiring 303a corresponds to the gate of the second switching element and the first layer wiring 303b corresponds to the gate of the first switching element. Embodiment 15 can be referred to for the first layer wiring 303b.

Either or both of the first layer wirings 303a and 303b may be a gate with a recess structure. With a recess structure, a short-channel effect can be suppressed. When the line width of the first layer wiring 303a is longer than that in a normal DRAM memory cell, the channel of a transistor as the second switching element can be long, so that the off-state current can be reduced.

Figure 12B:
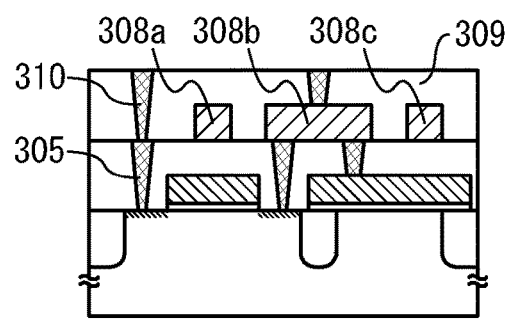

FIG. 12B illustrates a state in which the first interlayer insulator 304 is provided with a first contact plug 305 and thereover second layer wirings 308a to 308c, a second interlayer insulator 309, and a second contact plug 310 are formed.

The second layer wiring 308b connects the gate of the first switching element (first layer wiring 303b) to the second switching element. Note that the second layer wirings 308a and 308c correspond to the third layer wirings 111a and 111b, respectively, in FIG. 8B and are wirings interconnecting logic cells.

Figure 12C:
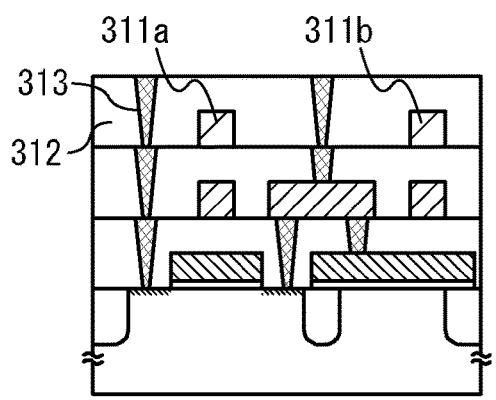

FIG. 12C illustrates a state in which third layer wirings 311a and 311b, a third interlayer insulator 312, and a third contact plug 313 are formed over the second interlayer insulator 309 and the second contact plug 310. Note that the third layer wirings 311a and 311b are wirings which correspond to the fourth layer wirings 114a and 114b, respectively, in FIG. 8C and interconnect logic cells.

Figure 12D:
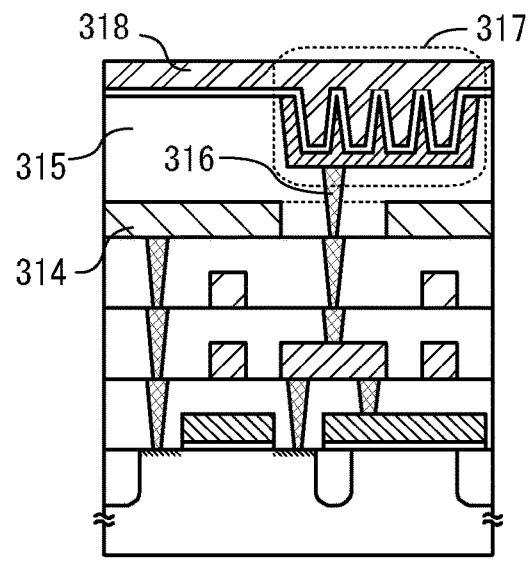

FIG. 12D illustrates a state in which a fourth layer wiring 314, a fourth interlayer insulator 315, a fourth contact plug 316, a capacitor 317, and a fifth layer wiring 318 are formed over the third interlayer insulator 312 and the third contact plug 313.

The positional relationship between the fourth layer wiring 314, the fourth contact plug 316, and the capacitor 317 is as found in a normal DRAM. The fourth layer wiring 314 is placed so as to avoid the fourth contact plug 316. The fifth layer wiring 318 and the fourth layer wiring 314 are placed parallel to each other and correspond to the terminals D and E, respectively, illustrated in FIG. 2C. The potentials of the fourth layer wiring 314 and the fifth layer wiring 318 are preferably complementary to each other during writing of configuration data.

In the programming unit of this embodiment, a capacitor can be formed over the gate of the first switching element (first layer wiring 303b), for example. In addition, the width of the gate (channel width) of the first switching element can also be two or more times as long as the minimum line width. Thus, a capacitor having larger capacitance than a capacitor used in a normal DRAM memory cell can be formed. Further, the width of the gate (channel length) of the second switching element (first layer wiring 303a) can also be two or more times as long as that of a transistor used in a normal DRAM memory cell.

Consequently, owing to the effect obtained through combination of the capacitor having larger capacitance than that in a normal DRAM and the transistor having a longer channel than that in the normal DRAM, time during which charge can be held in the capacitor can be longer than that in the normal DRAM.

An area necessary for an SRAM is $50\ F^2$ or more (F denotes the minimum line width) and does not include the area of (a portion corresponding to) the first switching element. In the programming unit of this embodiment, on the assumption that the width of the gate of the second switching element (first layer wiring 303a) is 3F and the length of the gate of the first switching element (first layer wiring 303b) is 9F, an area necessary for forming the switching elements is $32\ F^2$.

That is, the programming unit can be formed in a sufficiently smaller area than that in use of an SRAM. Note that when the first switching element and second switching element are each formed with the minimum line width, the programming unit can be formed in a still more smaller area ($14\ F^2$). Even in this case, a portion that can be used for the capacitor is larger than that in a normal DRAM.

Figure 13A:
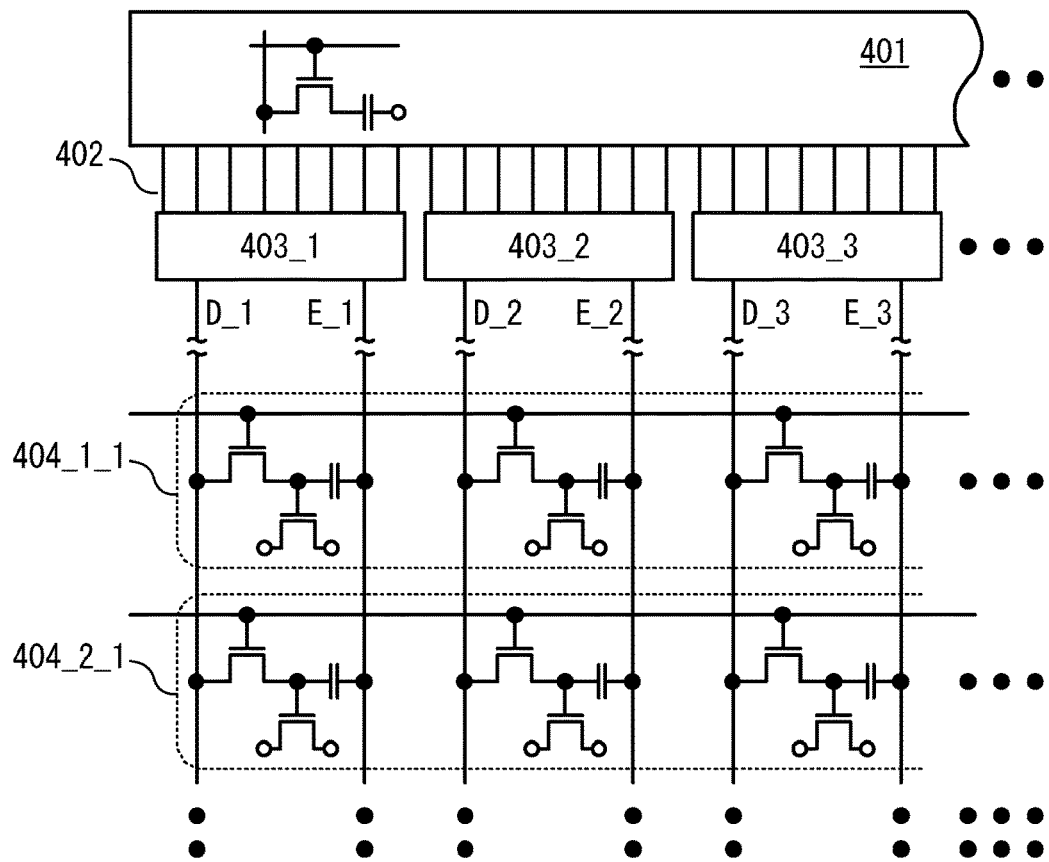
FIGS. 13A to 13C illustrate a semiconductor device using a programming unit and an operation example of the semiconductor device.

FIG. 13A is a block diagram of a circuit structure of a semiconductor device having such a programming unit. This semiconductor device includes a memory region 401. Although there is no particular limitation on the type of the memory cell included in the memory region 401, use of a DRAM is preferred in that the above programming unit can be formed at the same time, power consumption can be lower than that in use of an SRAM, and a soft error is unlikely to occur.

In the memory region 401, configuration data of a plurality of patterns which is used for a dynamic reconfiguration is stored. For example, configuration data of first to eighth patterns, eight patterns in total, is stored to be output when needed, so that necessary circuit configurations can be achieved.

For example, the first pattern corresponds to an a-b-c-d circuit configuration, the second pattern corresponds to an a-c-b-d circuit configuration, and the third pattern corresponds to an a-d-b-c circuit configuration. The data consists of the respective states, into which the programming units need to be placed in accordance with the circuit configurations. In addition, the circuit configuration of the first pattern is realized in the first operation period, and in the next operation period after a period of writing of configuration data, the circuit configuration of the second pattern is realized.

One end of each of bit lines 402 of the memory region 401 is connected to a selection circuit 403. On the basis of data output from the memory region 401, the selection circuit 403 outputs a signal corresponding to configuration data and the complementary signal. Note that as the complementary signal, a signal of a reference bit line in obtaining the signal corresponding to configuration data may be used.

In FIG. 13A, one selection circuit 403 corresponds to eight bit lines 402, that is, one of the eight patterns is physically selected in this circuit structure. However, without limitation to this structure, one selection circuit 403 may correspond to one bit line 402, in which case one of the eight patterns is virtually selected.

A data wiring D through which the signal corresponding to configuration data is transmitted and a data wiring E through which the complementary signal is transmitted are both connected to a programming unit in the switch 404 in the logic circuit region, so that a circuit configuration can be achieved. Here, in general, since the memory region 401 and the logic circuit region are apart with a distance therebetween, it takes time to transmit data. When the distance is about 1 cm, about several hundreds of nanoseconds are taken, although the necessary time depends on the product of the capacitance and resistance of a wiring.

If the channel of the second switching element is long and the capacitance of the capacitor is large in the programming unit, it also takes long time to write data. However, such a time to write data does not matter in practice, when the time to write data is substantially equal to or shorter than the time to transmit data described above or is preferably one-tenth or less of the time to transmit data.

The time constant of a normal DRAM in an on-state is about one nanosecond. When this time constant is ten times as large as that in the normal DRAM because the channel of the second switching element is long and the capacitance of the capacitor is large in the programming unit, the time taken to write data can be 100 nanoseconds.

Therefore, for example, when data transmittance takes 500 nanoseconds, the time taken from the time the programming unit is turned on by the time it is turned off is the sum of the time taken to transmit data (500 nanoseconds) and the time taken to complete transfer of charge to the capacitor (100 nanoseconds). The latter time can reduce as the channel of the second switching element is shorter and the capacitance of the capacitor is smaller. However, the former time occupies most of the time taken from the time the programming unit is turned on by the time it is turned off. Therefore, decreasing the latter time more is little effective.

When the time constant is large in an on-state as described above, a short-channel effect is suppressed and therefore the time constant in the off-state is also as large as or larger than that in an on-state. Therefore, in the case where this time constant is ten times as large as that in a normal DRAM because the channel of the second switching element is long and the capacitance of the capacitor is large in the programming unit, 6 or less refreshes per second are sufficient when 60 refreshes per second are needed for the normal DRAM.

In terms of the effect of reducing the frequency of refreshes, even if the time required for data transmission is sufficiently short, the channel of the second switching element and the capacitance of the capacitor in the programming unit may be increased.

Figure 13B:
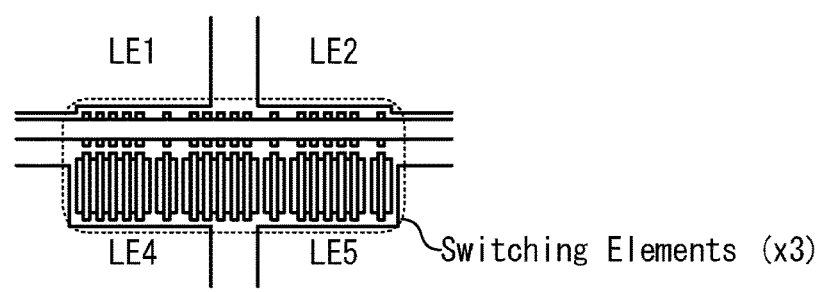

In FIG. 13B, the shape of a switch of this embodiment is illustrated, and the switch can be very compactly formed in the middle of the logic cells LC1, LC2, LC4, and LC5. Note that in FIG. 13B, three switches are formed in the dotted line frame.

Figure 13C:
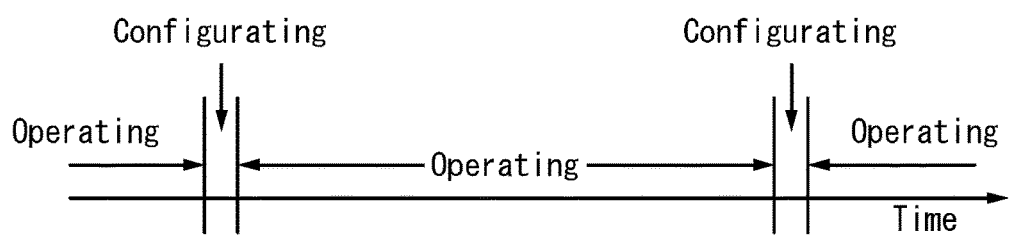

FIG. 13C illustrates an operation of the FPGA of this embodiment. As illustrated in FIG. 13C, there is a configuration period between operation periods (logic operation periods). Here, one operation period is determined by the interval between adjacent configuration periods and is the time during which the capacitor of the programming unit can hold charge. For example, in the above example, 6 or less refreshes per second are sufficient and therefore one operation period is 167 milliseconds or more.

However, configurations may be performed at shorter intervals depending on the case. This interval is not necessarily always the same and can be changed as needed.

The configuration period depends on the number of logic cells in the FPGA. For example, 1000 times as long time as the time required for writing to one programming unit is sufficient for a matrix of 1000 rows by 1000 columns of logic cells, i.e., one million logic cells in total (20 million or more programming units), because data can be written at the same time to one row of programming units in a switch and the like which belong to each logic cell.

For example, when the time required for writing to one programming unit is 600 nanoseconds as described above, it takes 600 microseconds, which is thousand times as long as the time for writing to one programming unit, to complete a configuration operation for all the logic elements and thereby form a circuit configuration.

Further, as described above, since the configuration data of the circuit configurations of eight patterns is stored in advance in the memory region 401, one million logic cells are capable of the same level of performance as at most eight millions of logic cells.

This application is based on Japanese Patent Application Serial No. 2011-111098 filed with the Japan Patent Office on May 18, 2011, the entire contents of which are hereby incorporated by reference.

What is claimed is:

1. A semiconductor device comprising:
    a first wiring;
    a second wiring;
    a first circuit;
    a second circuit;
    a first element including a first electrode and a second electrode;
    a second element including a third electrode and a fourth electrode;
    a first transistor;
    a second transistor;
    a third transistor; and
    a fourth transistor,
    wherein the second transistor is configured to control a connection between a gate of the first transistor and the first wiring, and between the first electrode and the first wiring, wherein the fourth transistor is configured to control a connection between a gate of the third transistor and the first wiring, and between the third electrode and the first wiring, wherein the first circuit and the second circuit are configured to supply potentials to the first wiring and to the second wiring, respectively, wherein it is configured that, when the second transistor is on, the first electrode is supplied with a first potential through the first wiring, and the second electrode is supplied with a second potential through the second wiring, wherein it is configured that, when the fourth transistor is on, the third electrode is supplied with a third potential through the first wiring, and the fourth electrode is supplied with a fourth potential through the second wiring, wherein the second potential is varied in accordance with the first potential, and wherein the fourth potential is varied in accordance with the third potential.

2. The semiconductor device according to claim 1, wherein a channel formation region of the second transistor comprises an oxide semiconductor.

3. The semiconductor device according to claim 1, wherein hydrogen concentration in a channel formation region of the second transistor is less than or equal to $5\times10^{19}/cm^3$.

4. The semiconductor device according to claim 1, wherein the first element is a capacitor.

5. The semiconductor device according to claim 1, wherein an off-state current density of the second transistor is less than or equal to 100 zA/μm.

6. The semiconductor device according to claim 1, wherein the first transistor comprises silicon.

7. A semiconductor device comprising:
a first wiring;
a second wiring;
a first circuit;
a second circuit;
a first element including a first electrode and a second electrode;
a second element including a third electrode and a fourth electrode;
a first transistor;
a second transistor;
a third transistor; and
a fourth transistor,
wherein the second transistor is configured to control a connection between a gate of the first transistor and the first wiring, and between the first electrode and the first wiring,
wherein the fourth transistor is configured to control a connection between a gate of the third transistor and the first wiring, and between the third electrode and the first wiring,
wherein, when the second transistor is on, the first circuit and the second circuit are configured to supply potentials to the first electrode through the first wiring and to the second electrode through the second wiring, respectively,
wherein, when the fourth transistor is on, the first circuit and the second circuit are configured to supply potentials to the third electrode through the first wiring and to the fourth electrode through the second wiring, respectively, wherein it is configured that, when the second transistor is on, a potential supplied from the second circuit is varied in accordance with a potential supplied from the first circuit, and wherein it is configured that, when the fourth transistor is on, a potential supplied from the second circuit is varied in accordance with a potential supplied from the first circuit.

8. The semiconductor device according to claim 7, wherein a channel formation region of the second transistor comprises an oxide semiconductor.

9. The semiconductor device according to claim 7, wherein hydrogen concentration in a channel formation region of the second transistor is less than or equal to $5\times10^{19}/cm^3$.

10. The semiconductor device according to claim 7, wherein the first element is a capacitor.

11. The semiconductor device according to claim 7, wherein an off-state current density of the second transistor is less than or equal to 100 zA/μm.

12. The semiconductor device according to claim 7, wherein the first transistor comprises silicon.

13. A semiconductor device comprising:
a first wiring;
a second wiring;
a first circuit;
a second circuit;
a first element including a first electrode and a second electrode;
a second element including a third electrode and a fourth electrode;
a first transistor;
a second transistor;
a third transistor; and
a fourth transistor,
wherein the second transistor is configured to control a connection between a gate of the first transistor and the first wiring, and between the first electrode and the first wiring,
wherein the fourth transistor is configured to control a connection between a gate of the third transistor and the first wiring, and between the third electrode and the first wiring,
wherein the first circuit and the second circuit are configured to supply potentials to the first wiring and to the second wiring, respectively,
wherein it is configured that the first electrode is supplied with a potential supplied from the first wiring, and the second electrode is supplied with a potential supplied from the second wiring,
wherein it is configured that the third electrode is supplied with a potential supplied from the first wiring, and the fourth electrode is supplied with a potential supplied from the second wiring, and
wherein the potential supplied from the first circuit is varied in accordance with the potential supplied from the second circuit.

14. The semiconductor device according to claim 13, wherein a channel formation region of the second transistor comprises an oxide semiconductor.

15. The semiconductor device according to claim 13, wherein hydrogen concentration in a channel formation region of the second transistor is less than or equal to $5\times10^{19}/cm^3$.

16. The semiconductor device according to claim 13, wherein the first element is a capacitor.

17. The semiconductor device according to claim 13, wherein an off-state current density of the second transistor is less than or equal to 100 zA/μm.

18. The semiconductor device according to claim 13, wherein the first transistor comprises silicon.

\* \* \* \* \*